(12) United States Patent
Chiang et al.

(10) Patent No.: US 12,266,847 B2
(45) Date of Patent: *Apr. 1, 2025

(54) SEMICONDUCTOR PACKAGES AND MANUFACTURING METHODS THEREOF

(71) Applicant: Taiwan Semiconductor Manufacturing Company, Ltd., Hsinchu (TW)

(72) Inventors: Yung-Ping Chiang, Hsinchu County (TW); Chao-Wen Shih, Hsinchu County (TW); Shou-Zen Chang, New Taipei (TW); Albert Wan, Hsinchu (TW); Yu-Sheng Hsieh, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/395,617

(22) Filed: Dec. 24, 2023

(65) Prior Publication Data
US 2024/0128635 A1  Apr. 18, 2024

Related U.S. Application Data

(63) Continuation of application No. 17/874,252, filed on Jul. 26, 2022, now Pat. No. 11,855,333, which is a
(Continued)

(51) Int. Cl.
*H01Q 1/22* (2006.01)
*H01L 21/56* (2006.01)
(Continued)

(52) U.S. Cl.
CPC ........ *H01Q 1/2283* (2013.01); *H01L 21/768* (2013.01); *H01L 23/3107* (2013.01); *H01L 23/3128* (2013.01); *H01L 23/481* (2013.01); *H01L 23/528* (2013.01); *H01L 23/66* (2013.01); *H01L 24/14* (2013.01); *H01L 24/82* (2013.01); *H01Q 1/38* (2013.01); *H01Q 9/04* (2013.01); *H01Q 21/065* (2013.01); *H01L 21/568* (2013.01); *H01L 2223/6627* (2013.01); *H01L 2223/6677* (2013.01);
(Continued)

(58) Field of Classification Search
CPC ... H01Q 1/2283; H01L 23/3128; H01L 23/66; H01L 24/82; H01L 23/3107; H01L 23/481
See application file for complete search history.

(56) References Cited

U.S. PATENT DOCUMENTS 8,361,842 B2  1/2013 Yu et al.
8,680,647 B2  3/2014 Yu et al.
(Continued)

*Primary Examiner* — Jose R Diaz
(74) *Attorney, Agent, or Firm* — JCIPRNET

(57) ABSTRACT

Sensor packages and manufacturing methods thereof are disclosed. One of the sensor packages includes a semiconductor chip and a redistribution layer structure. The semiconductor chip has a sensing surface. The redistribution layer structure is arranged to form an antenna transmitter structure aside the semiconductor chip and an antenna receiver structure over the sensing surface of the semiconductor chip.

20 Claims, 18 Drawing Sheets

Related U.S. Application Data continuation of application No. 17/227,387, filed on Apr. 12, 2021, now Pat. No. 11,515,618, which is a continuation of application No. 16/858,743, filed on Apr. 27, 2020, now Pat. No. 10,978,782, which is a continuation of application No. 16/219,979, filed on Dec. 14, 2018, now Pat. No. 10,636,713, which is a continuation of application No. 15/235,106, filed on Aug. 12, 2016, now Pat. No. 10,157,807.

(60) Provisional application No. 62/341,633, filed on May 26, 2016.

(51) Int. Cl.
*H01L 21/768* (2006.01)
*H01L 23/00* (2006.01)
*H01L 23/31* (2006.01)
*H01L 23/48* (2006.01)
*H01L 23/528* (2006.01)
*H01L 23/66* (2006.01)
*H01Q 1/38* (2006.01)
*H01Q 9/04* (2006.01)
*H01Q 21/06* (2006.01)

(52) U.S. Cl.
CPC ............... *H01L 2224/13024* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/18* (2013.01); *H01L 2924/1431* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 11,855,333 B2 * | 12/2023 | Chiang ............... H01L 23/3128 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

* cited by examiner

SEMICONDUCTOR PACKAGES AND MANUFACTURING METHODS THEREOF

CROSS-REFERENCE TO RELATED APPLICATION

This application is a continuation application of and claims the priority benefit of a prior application Ser. No. 17/874,252, filed on Jul. 26, 2022. The prior application Ser. No. 17/874,252 is a continuation application of and claims the priority benefit of a prior application Ser. No. 17/227,387, filed on Apr. 12, 2021. The prior application Ser. No. 17/227,387 is a continuation application of and claims the priority benefit of a prior application Ser. No. 16/858,743, filed on Apr. 27, 2020. The prior application Ser. No. 16/858,743 is a continuation application of and claims the priority benefit of a prior application Ser. No. 16/219,979, filed on Dec. 14, 2018. The prior application Ser. No. 16/219,979 is a continuation application of and claims the priority benefit of a prior application Ser. No. 15/235,106, filed on Aug. 12, 2016. The prior application Ser. No. 15/235,106 claims the priority benefit of U.S. provisional application Ser. No. 62/341,633, filed on May 26, 2016. The entirety of each of the above-mentioned patent applications is hereby incorporated by reference herein and made a part of this specification.

BACKGROUND

Assembling several integrated circuits required by a system in a single package is now a common practice for complex electronic systems, and is often referred to as system-in-package (SIP). A SIP assembly may contain digital, analog, mixed-signal, and often radio-frequency functions in a single package. For SIP applications, an antenna transceiver designed to transmit or receive electromagnetic waves is applied for millimeter wave wireless communication, WiFi, and telecommunication, etc. However, the large size of the antenna transceiver and the production cost are problematic.

DETAILED DESCRIPTION

Figure 1A:
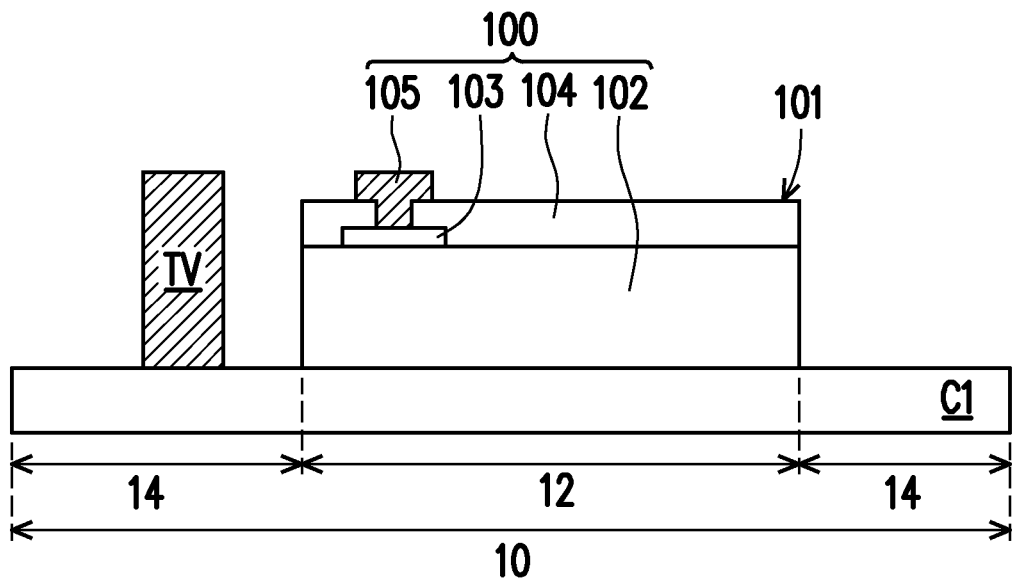
FIG. 1A to FIG. 1G are cross-sectional views of a method of forming a sensor package in accordance with some embodiments.

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1G are cross-sectional views of a method of forming a sensor package in accordance with some embodiments.

Referring to FIG. 1A, a carrier C1 is provided with a semiconductor chip 100 and at least one through-via TV. In some embodiments, the carrier C1 has a de-bonding layer (not shown) and a dielectric layer (not shown) formed thereon, and the de-bonding layer is between the carrier C1 and the dielectric layer. In some embodiments, the carrier C1 is a glass substrate, the de-bonding layer is a light-to-heat conversion (LTHC) release layer formed on the glass substrate, and the dielectric layer is a polybenzoxazole (PBO) layer formed on the de-bonding layer, for example. In some embodiments, the carrier C1 has a package region 10 including a chip region 12 and a periphery region 14 aside or around the chip region 12, the semiconductor chip 100 is in the chip region 12 and the through-via TV is in the periphery region 14. In some embodiments, the semiconductor chip 100 is a logic chip, a sensor chip or an imaging chip, and has a sensing surface 101 at the front side thereof. In some embodiments, the semiconductor chip 100 has a substrate 102, at least one pad 103 over the substrate 102, a passivation layer 104 over the substrate 102 and exposing a portion of the pad 103, and at least one connector 105 over the passivation layer 104 and electrically connected to the pad 103. Specifically, the connector 105 is formed as the top portion of the semiconductor chip 100. The connector 105 protrudes from the remaining portion or lower portion of the semiconductor chip 100. In some embodiments, the connector 105 includes a solder bump, a gold bump, a copper post or the like, and is formed with an electroplating process. In some embodiments, the through-via TV includes copper, nickel, solder, a combination thereof or the like, and is formed with an electroplating process. In some embodiments, the through-via TV is formed on the carrier C1 after the semiconductor chip 100 is picked and placed on the carrier C1. In alternative embodiments, the through-via TV is formed on the carrier C1 before the semiconductor chip 100 is picked and placed on the carrier C1.

Figure 1B:
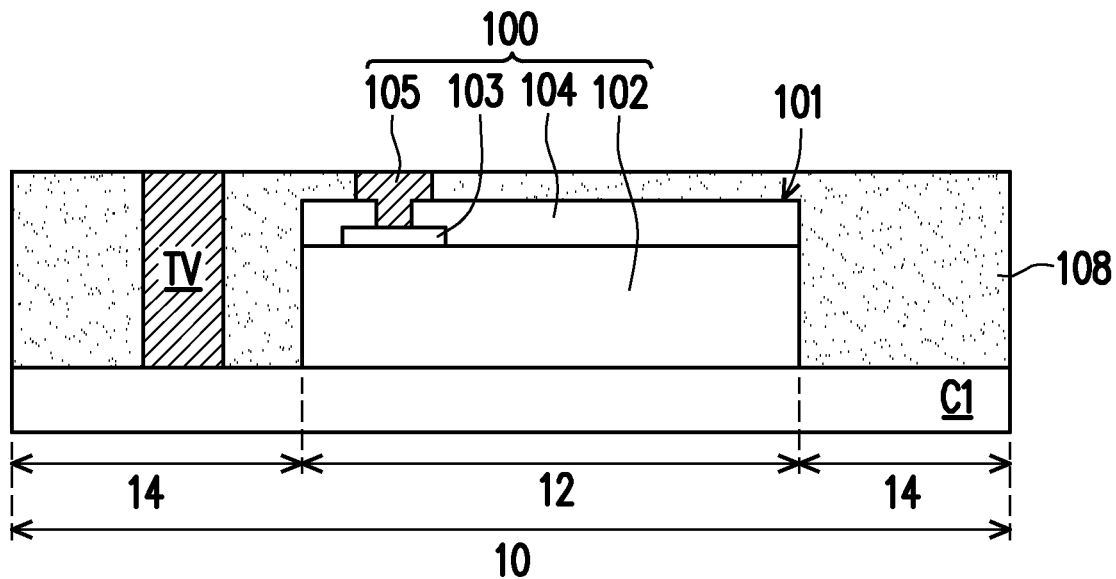

Referring to FIG. 1B, an encapsulant 108 is formed over the carrier C1 to encapsulate the semiconductor chip 100 and the through-via TV. In some embodiments, the encapsulant 108 surrounds the semiconductor chip 100 and the through-via TV, and exposes the surfaces of the through-via TV and the connector 105. The encapsulant 108 includes a molding compound such as epoxy, a photo-sensitive material such as polybenzoxazole (PBO), polyimide or benzocyclobutene (BCB), a combination thereof or the like. The method of forming the encapsulant 108 includes forming an encapsulant material layer (not shown) on the carrier C1 covering the semiconductor chip 100 and the through-via TV, and performing a grinding process to partially remove the encapsulant material layer until the surfaces of the through-via TV and the connector 105 are exposed.

Figure 1C:
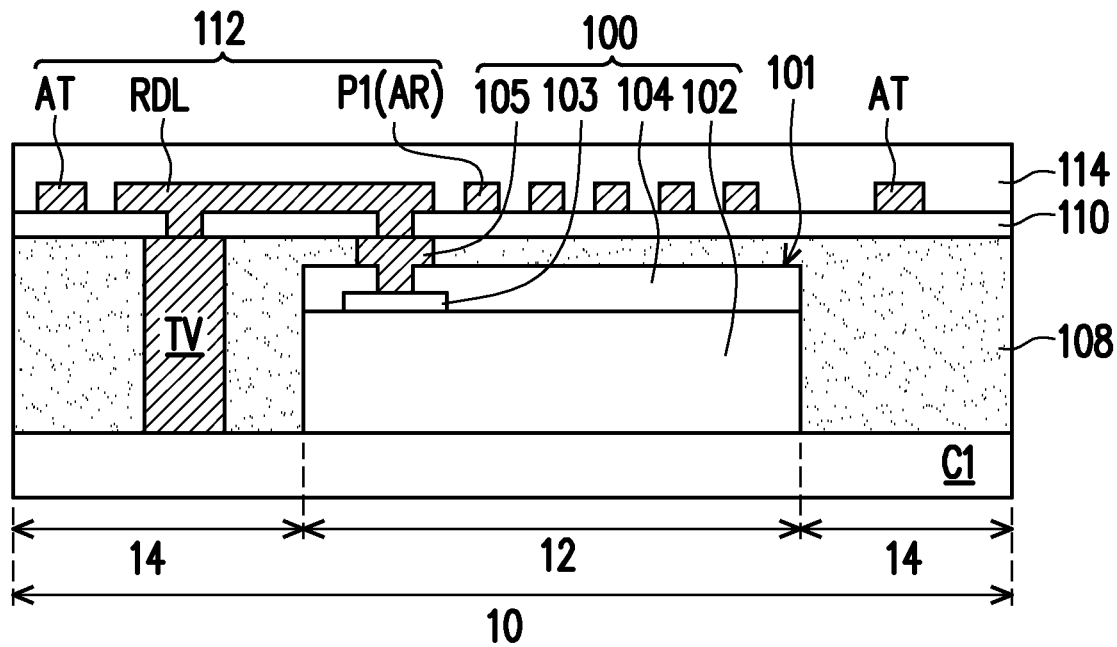

Referring to FIG. 1C, a redistribution layer structure 112 is formed over the sensing surface 101 (and over the encapsulant 108 in the instant example) of the semiconductor chip 100, which is patterned to define an antenna transmitter structure AT, an antenna receiver structure AR and a redistribution layer RDL. The redistribution layer structure 112 is referred to as a "front-side redistribution layer structure" through the specification. In some embodiments, the redistribution layer RDL is formed between the antenna transmitter structure AT and the antenna receiver structure AR. In some embodiments, the antenna receiver structure AR includes a plurality of first patterns P1 over the sensing surface 101 of the semiconductor chip 100. In some embodiments, the redistribution layer RDL is formed to electrically connect to the through-via TV and the connector 105, the antenna transmitter structure AT is formed to electrically couple to a signal transmitting terminal (not shown), and the antenna receiver structure AR is formed to electrically couple to the semiconductor chip 100.

Figure 2:
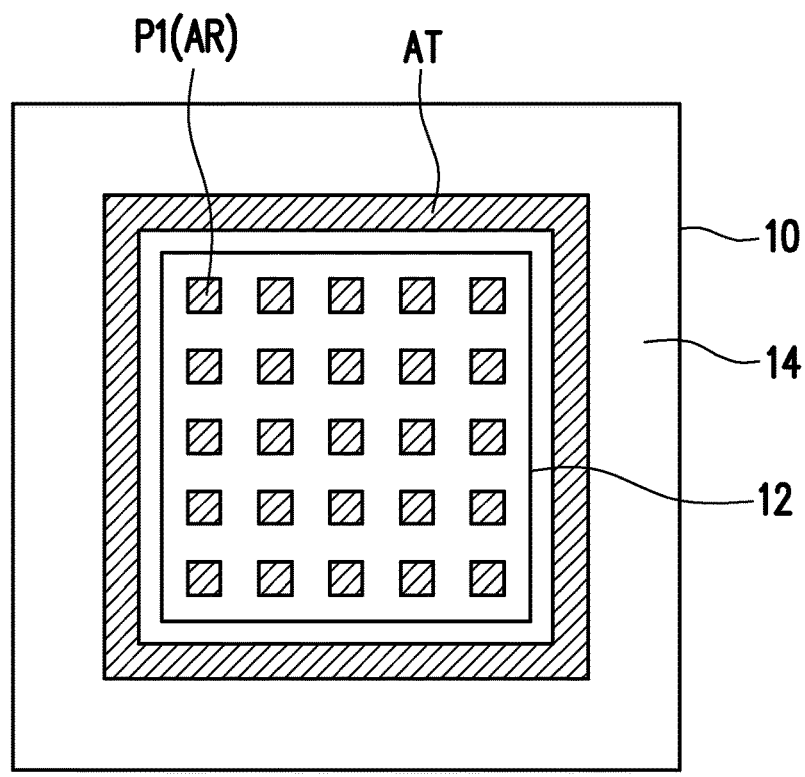
FIGS. 2 and 3 are simplified top views of antenna transmitter structures and antenna receiver structures of sensor packages in accordance with some embodiments.
Figure 3:
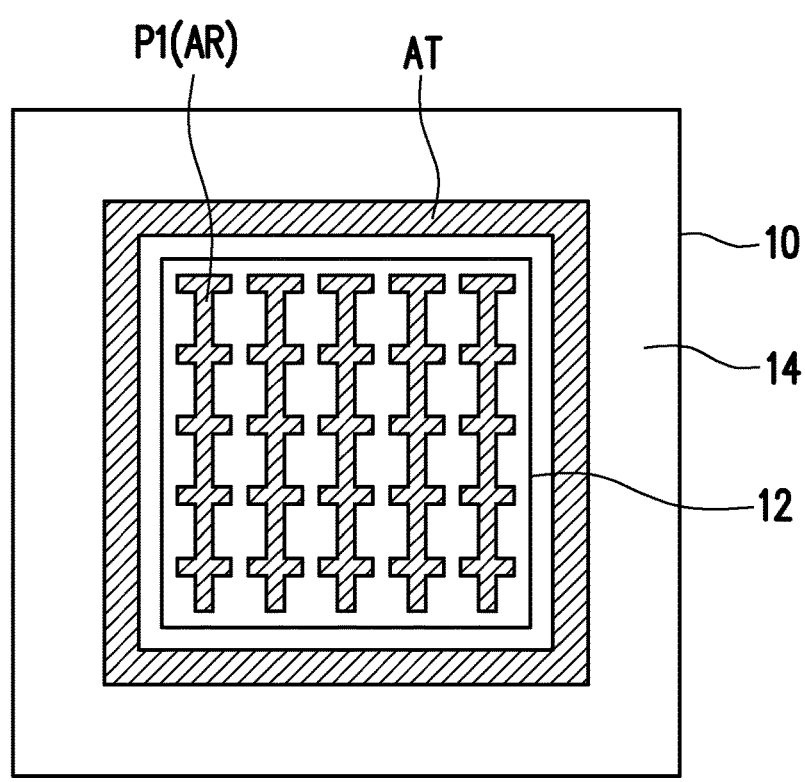

In some embodiments, the first patterns P1 of the antenna receiver structure AR are arranged in an array, and the antenna transmitter structure AT surrounds the first patterns P1 of the antenna receiver structure AR. In some embodiments, the transmitter structure AT has a ring shape, and each of the first patterns P1 of the antenna receiver structure AR has an island shape or a fishbone shape, as shown in the top views of FIGS. 2 and 3. However, the disclosure is not limited thereto. The shape of each of the antenna transmitter structure AT and the antenna receiver structure AR can be adjusted depending on the frequency and the polarity of the electromagnetic field of the antenna transceiver. In other words, upon the process requirements, the transmitter structure AT can have a ring shape, a bar shape, a spiral shape, a wave shape, a meandering shape or a combination thereof, and each of the first patterns P1 of the antenna receiver structure AR can have a ring shape, a snake shape, a bar shape, a fishbone shape, a fence shape, a grid shape, a ring shape or a combination thereof.

The method of forming the redistribution layer structure 112 includes the following operations. In some embodiments, a polymer layer 110 is formed across the chip region 12 and the periphery region 14 and exposes the surfaces of the through-via TV and the connector 105. In some embodiments, the polymer layer 110 includes PBO, polyimide, BCB, a combination thereof or the like. Thereafter, a seed material layer (not shown) is formed across the chip region 12 and the periphery region 14, covers the surface of the polymer layer 110 and the surfaces of the through-via TV and the connector 105 exposed by the polymer layer 110. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed redistribution layer structure 112. Afterwards, a plating process is performed to form a metal material layer (e.g., a copper layer) on the seed material layer exposed by the openings of the photoresist layer. The photoresist layer and the underlying seed material layer are removed, so as to form the redistribution layer structure 112. Thereafter, a polymer layer 114 is formed over the redistribution layer structure 112. In some embodiments, the polymer layer 114 includes PBO, polyimide, BCB, a combination thereof or the like.

Figure 1D:
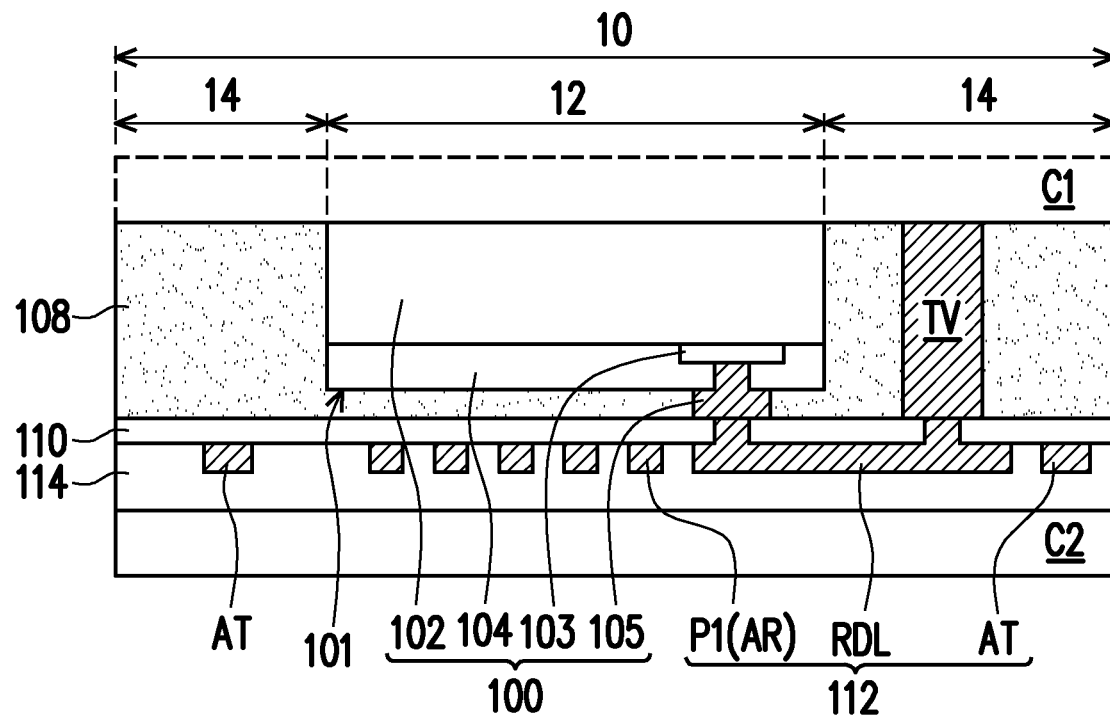

Referring to FIG. 1D, the carrier C1 is de-bonded from the backside of the structure, and another carrier C2 is bonded to the front side of the same structure. In some embodiments, the carrier C1 with the semiconductor chip 100, the through-via TV, the encapsulant 108 and the redistribution layer structure 112 is turned over and bonded to the carrier C2, the de-bonding layer of the carrier C1 is decomposed under heat of light, and the carrier C1 is then released from the structure formed thereon. In some embodiments, the carrier C2 is of the resulting structure. In some embodiments, the carrier C2 has a de-bonding layer (not shown) and a dielectric layer (not shown) formed thereon, the de-bonding layer is between the carrier C2 and the dielectric layer, and the dielectric layer is bonded to the polymer layer 114. In some embodiments, the carrier C2 is a glass substrate, the de-bonding layer is a LTHC release layer formed on the glass substrate, and the dielectric layer is a PBO layer formed on the de-bonding layer, for example.

Figure 1E:
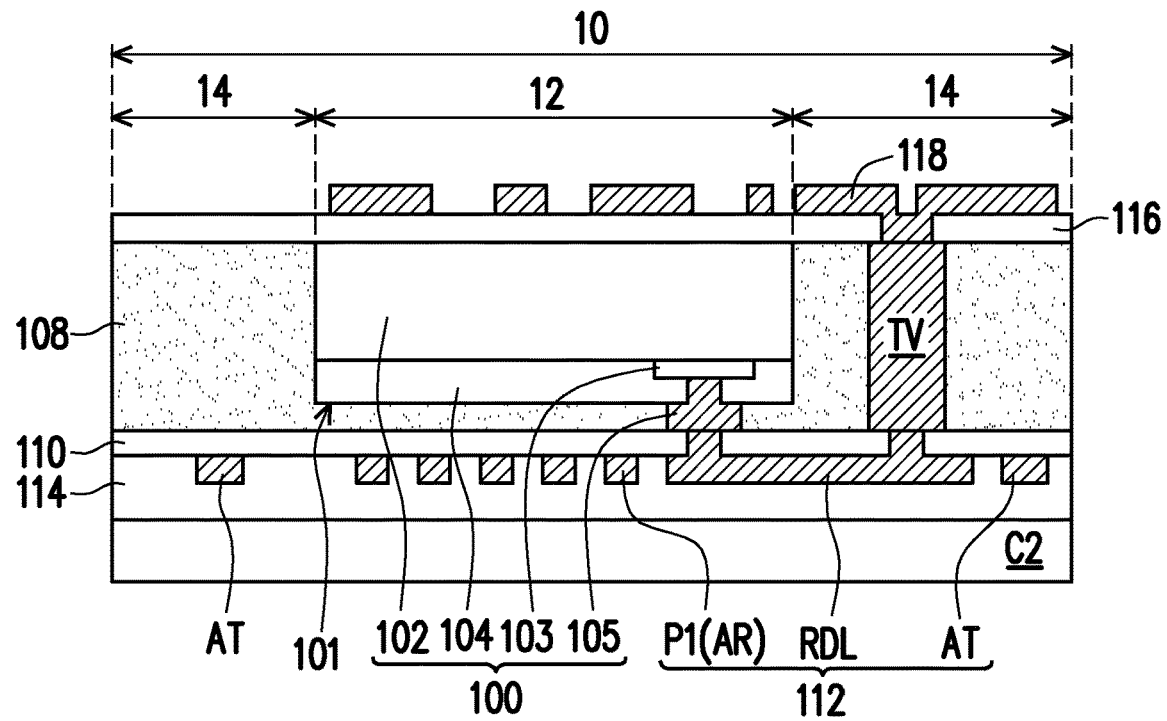

Referring to FIG. 1E, a redistribution layer structure 118 is formed over the backside of the semiconductor chip 100. The redistribution layer structure 118 is referred to as a "backside redistribution layer structure" through the specification. In some embodiments, the redistribution layer structure 118 is formed to electrically connect to the through-via TV.

The method of forming the redistribution layer structure 118 includes the following operations. In some embodiments, a polymer layer 116 is formed across the chip region 12 and the periphery region 14 and exposes the surface of the through-via TV. In some embodiments, the polymer layer 116 includes PBO, polyimide, BCB, a combination thereof or the like. Thereafter, a seed material layer (not shown) is formed across the chip region 12 and the periphery region 14, covers the surface of the polymer layer 116 and the surface of the through-via TV exposed by the polymer layer 116. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed redistribution layer structure 118. Afterwards, a plating process is performed to form a metal material layer (e.g., a copper layer) on the seed material layer exposed by the openings of the photoresist layer. The photoresist layer and the underlying seed material layer are removed, so as to form the redistribution layer structure 118.

Figure 1F:
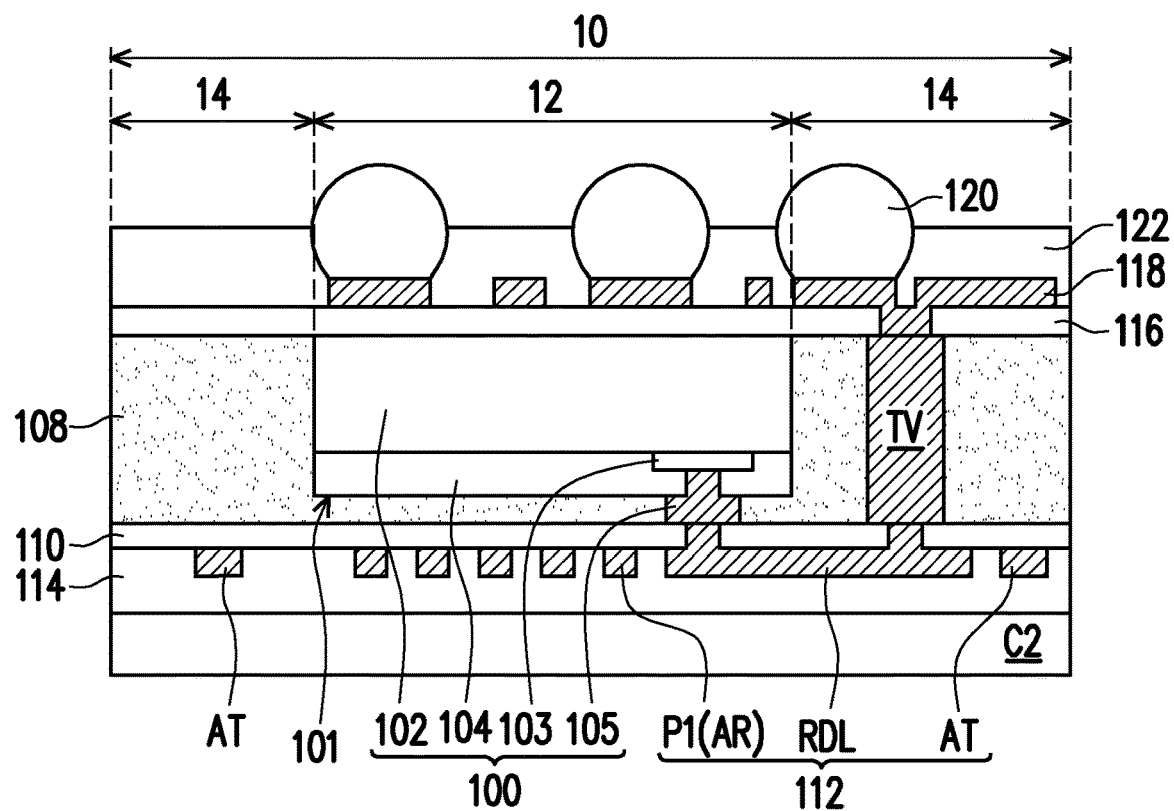

Referring to FIG. 1F, solder bumps (e.g., balls 120) are placed on and electrically connected to the redistribution layer structure 118. In some embodiments, the balls 120 are made of a conductive material with low resistivity, such as Sn, Pb, Ag, Cu, Ni, Bi or an alloy thereof, and are formed by a suitable process such as evaporation, plating, ball drop, or screen printing. Thereafter, an underfill layer 122 is optionally formed to encapsulate the redistribution layer structure 118 and the lower portions of the balls 120. The underfill layer 122 includes a molding compound such as epoxy, and is formed using dispensing, injecting, and/or spraying techniques.

The structure of FIG. 1F is exemplified as a ball grid array (BGA) package. However, the present disclosure is not limited thereto. In alternative embodiments, upon the process requirements, other packaging types such as a land grid array (LGA) package can also be applied.

Figure 1G:
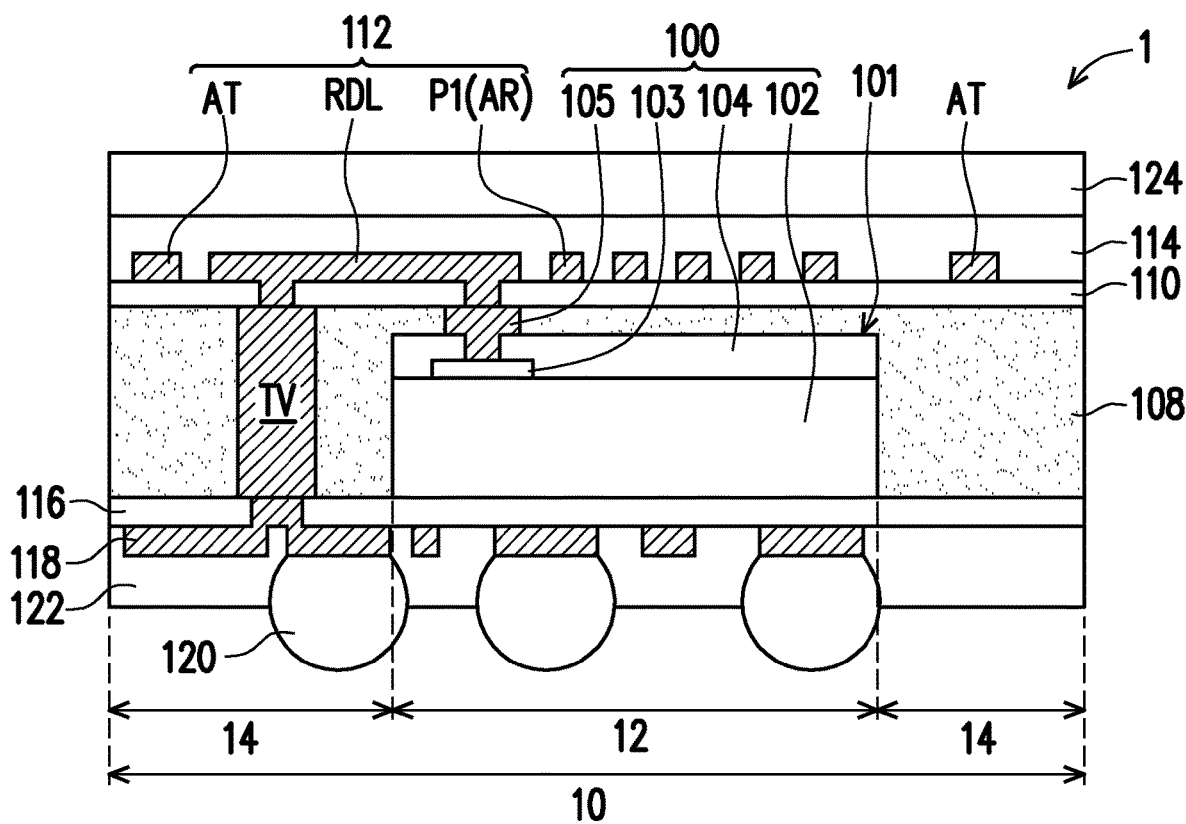

Referring to FIG. 1G, the carrier C2 is de-boned from the backside of the structure, and a protection layer 124 is optionally formed over the front side of the same structure. In some embodiments, the carrier C2 with the semiconductor chip 100, the through-via TV, the encapsulant 108, the redistribution layer structures 112/118 and the balls 120 is turned over, the de-bonding layer of the carrier C2 is decomposed under heat of light, and the carrier C2 is then released from the structure formed thereon. In some embodiments, the protection layer 124 is formed over the polymer layer 114. In some embodiments, the protection layer 124 is a dielectric layer or an insulating layer with a sufficient mechanical strength. In some embodiments, the protection layer 124 is configured to protect the underlying structure against mobile ions from, for example, the surface of a finger. A sensor package 1 of the disclosure as a fingerprint sensor package is thus completed.

In some embodiments, the first patterns P1 serve as sensing/detection electrodes or sensing pixels coupled to the semiconductor chip 100, and the capacitance formed between each of the first patterns P1 and the surface of the finger depending on unevenness of a fingerprint is detected, whereby a so-called fingerprint pattern is obtained. In alternative embodiments, the first patterns P1 serve as enhancement patterns for enhancing the intensity of an electromagnetic wave. In some embodiments, the first patterns P1 as enhancement patterns are floating electrodes which are, for example, partially overlapped with or separating from the sensing electrodes upon the design requirements.

The method described in FIG. 1A to FIG. 1G is called a "chip PnP (pick-and-place) first" process through the specification, in which a semiconductor chip 100 is picked and placed on a carrier before a backside redistribution layer structure 118 is formed. However, the present disclosure is not limited thereto. In some embodiments, the sensor package of the disclosure can be manufactured by a "backside RDL first" process in which a semiconductor chip 100 is picked and placed on a carrier after a backside redistribution layer structure 118 is formed.

FIG. 4A to FIG. 4F are cross-sectional views of a method of forming a sensor package in accordance with alternative embodiments. The materials and forming methods of the elements in FIG. 4A to FIG. 4F are similar to those described in FIG. 1A to FIG. 1G, so the difference between the methods are illustrated below, and the similarity is not iterated herein.

Figure 4A:
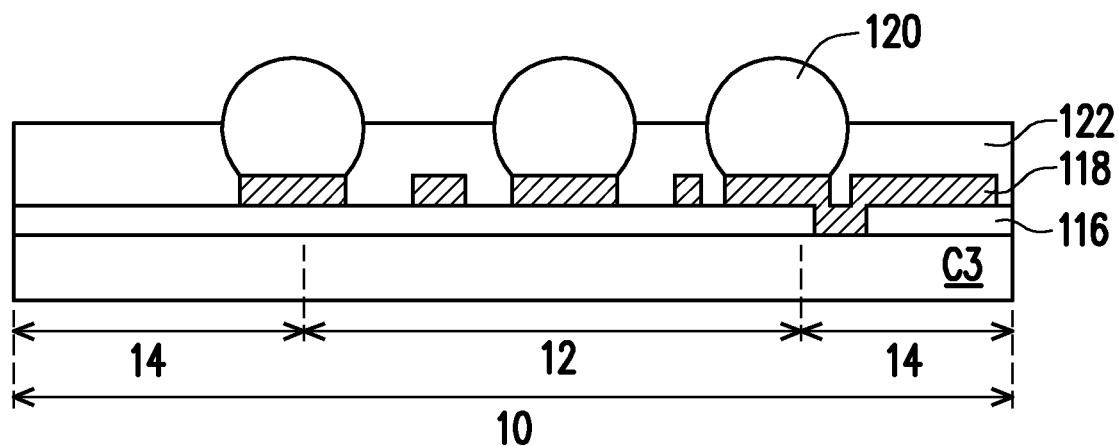
FIG. 4A to FIG. 4F are cross-sectional views of a method of forming a sensor package in accordance with alternative embodiments.

Referring to FIG. 4A, a carrier C3 is provided with a redistribution layer structure 118 (i.e. a backside redistribution layer structure) and balls 120. In some embodiments, the carrier C3 has a de-bonding layer and a dielectric layer formed thereon, and the de-bonding layer is between the carrier C3 and the dielectric layer. In some embodiments, the carrier C3 has a package region 10 including a chip region 12 and a periphery region 14 aside or around the chip region 12. In some embodiments, a polymer layer 116 is formed across the chip region 12 and the periphery region 14 and has an opening exposing a portion of the carrier C3. The redistribution layer structure 118 is formed over the polymer layer 116 filling in the opening. The balls 120 are placed on and electrically connected to the redistribution layer structure 118. An underfill layer 122 is formed to encapsulate the redistribution layer structure 118 and the lower portions of the balls 120.

Figure 4B:
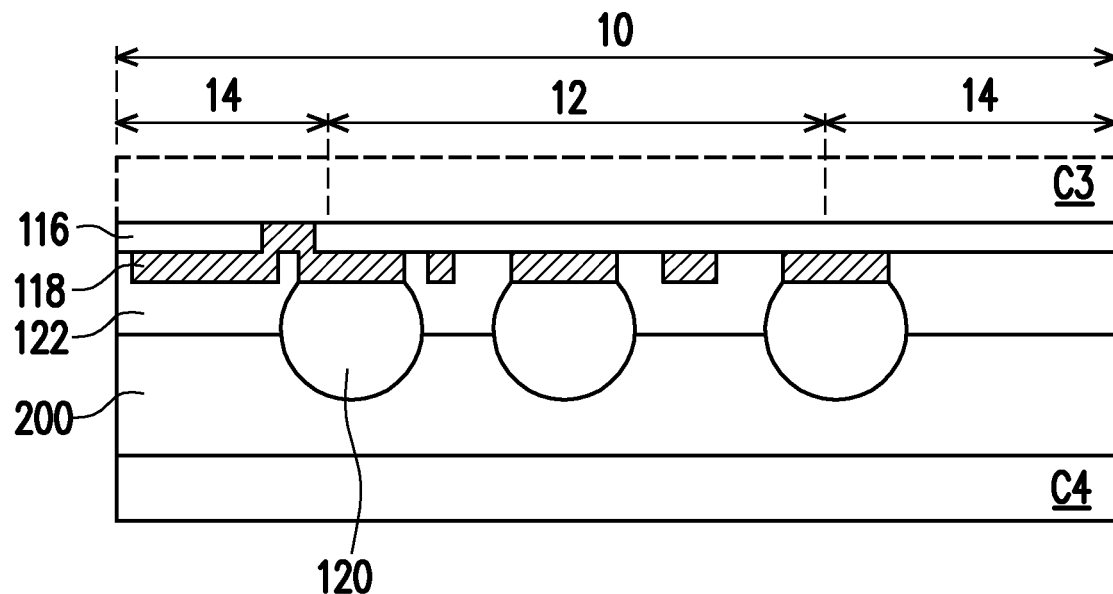

Referring to FIG. 4B, the structure including the redistribution layer structure 118 and the balls 120 is de-bonded from the carrier C3, and the same structure is turned over and bonded to another carrier C4 through a buffer layer 200. In some embodiments, the buffer layer 200 includes a polymer such as a molding compound and/or an adhesive. In some embodiments, the buffer layer 200 covers the exposed surfaces of the balls 120 and the underfill layer 122 after a pressing technique.

Figure 4C:
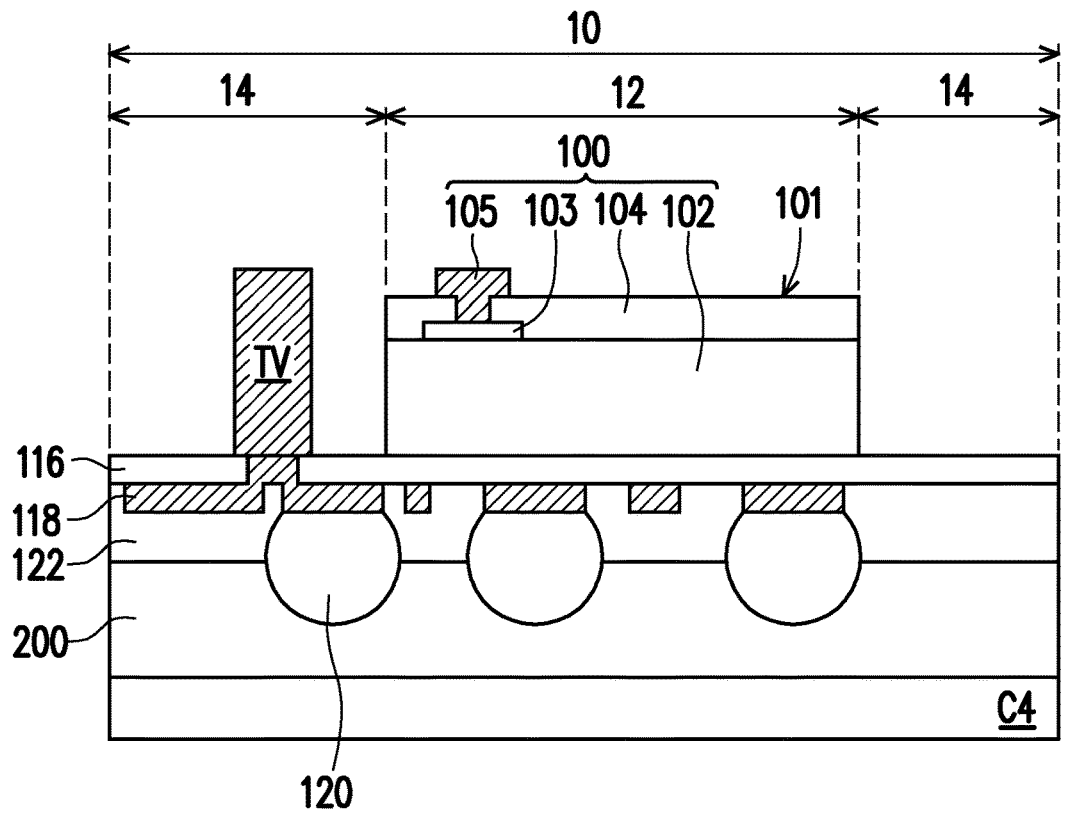

Referring to FIG. 4C, at least one through-via TV and a semiconductor chip 100 is placed on the carrier C4. In some embodiments, the through-via TV is formed over the polymer layer 116 and electrically connected to the redistribution layer structure 118, and the semiconductor chip 100 is bonded to the polymer layer 116 at the backside thereof. In some embodiments, the semiconductor chip 100 is a logic chip, a sensor chip or an imaging chip, and has a sensing surface 101 at the front side thereof. In some embodiments, the semiconductor chip 100 has a substrate 102, at least one pad 103 over the substrate 102, a passivation layer 104 over the substrate 102 and exposing a portion of the pad 103, and at least one connector 105 over the passivation layer 104 and electrically connected to the pad 103.

Figure 4D:
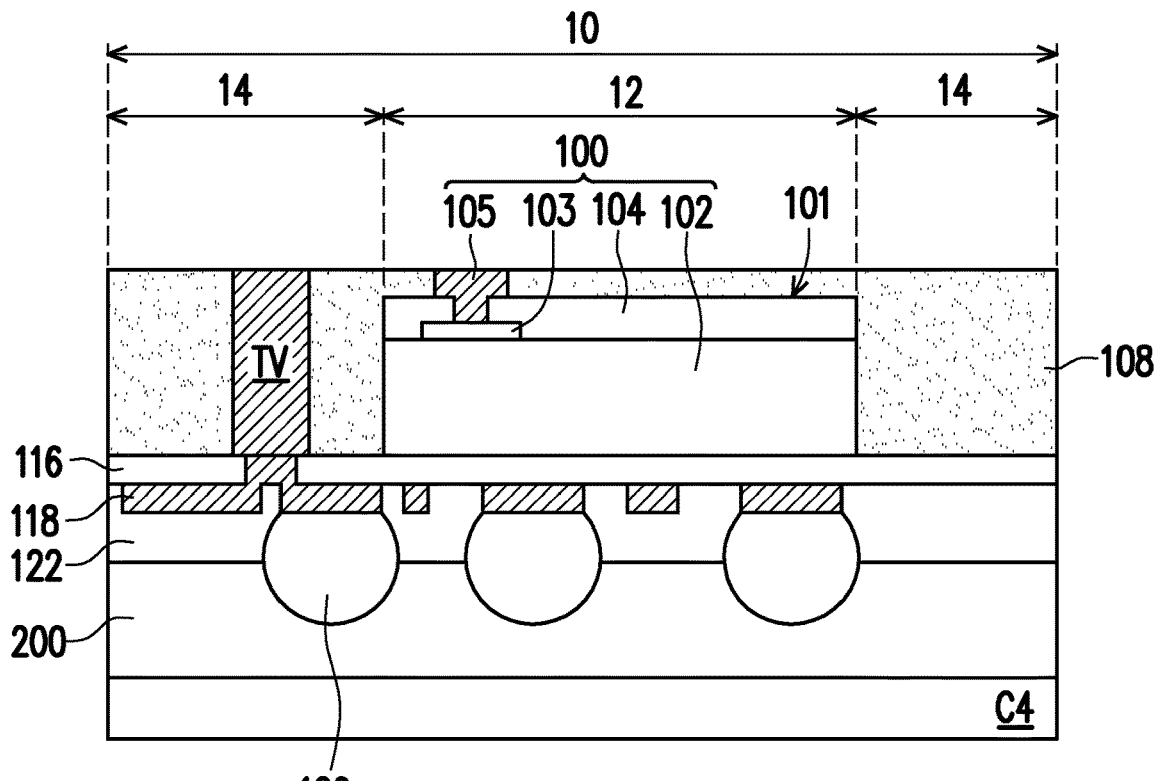

Referring to FIG. 4D, an encapsulant 108 is formed over the carrier C4 to encapsulate the semiconductor chip 100 and the through-via TV. In some embodiments, the encapsulant 108 surrounds the semiconductor chip 100 and the through-via TV, and exposes the surfaces of the through-via TV and the connector 105.

Figure 4E:
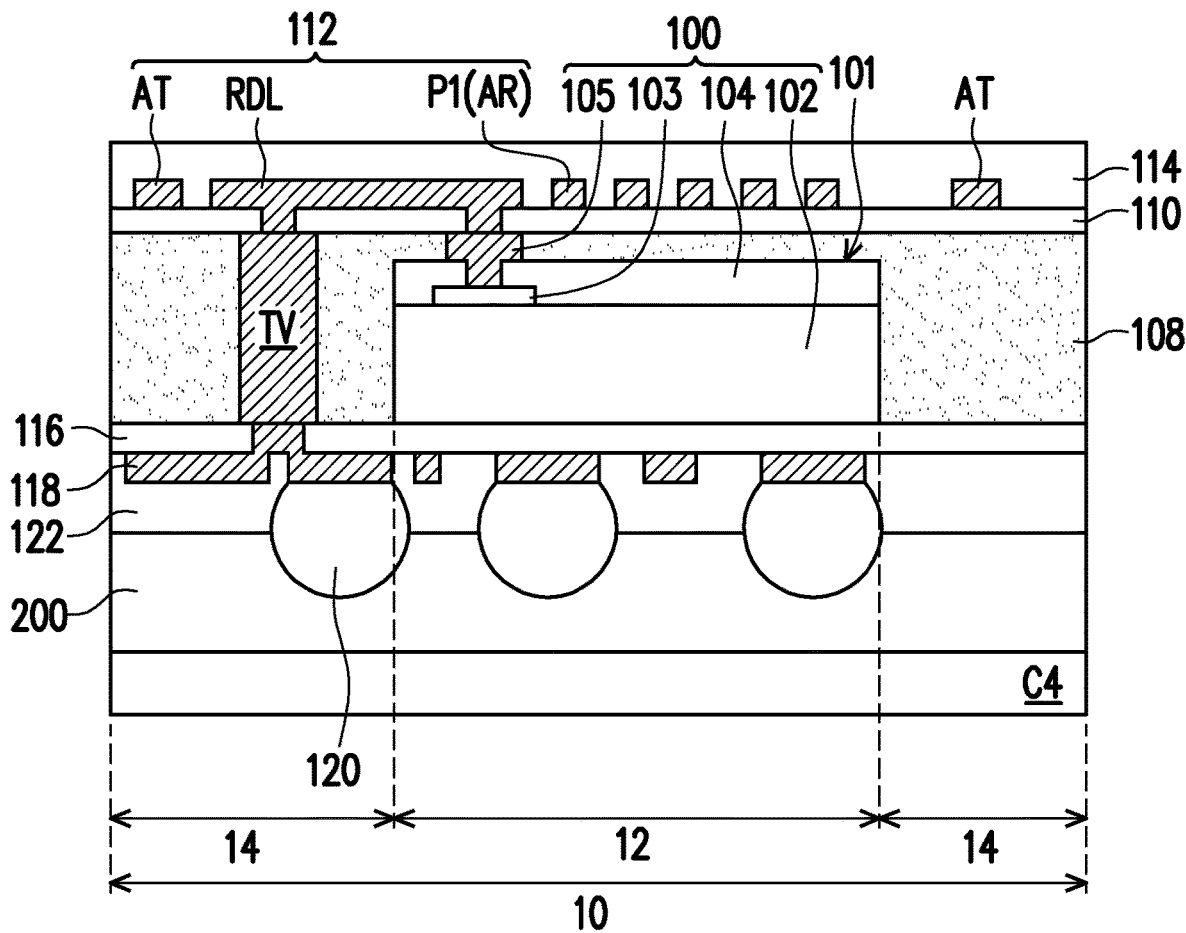

Referring to FIG. 4E, a redistribution layer structure 112 (i.e. a front-side redistribution layer structure) is formed over the sensing surface 101 of the semiconductor chip 100, wherein the forming of the redistribution layer structure 112 includes forming an antenna transmitter structure AT, an antenna receiver structure AR and a redistribution layer RDL. Thereafter, a polymer layer 114 is formed over the redistribution layer structure 112.

Figure 4F:
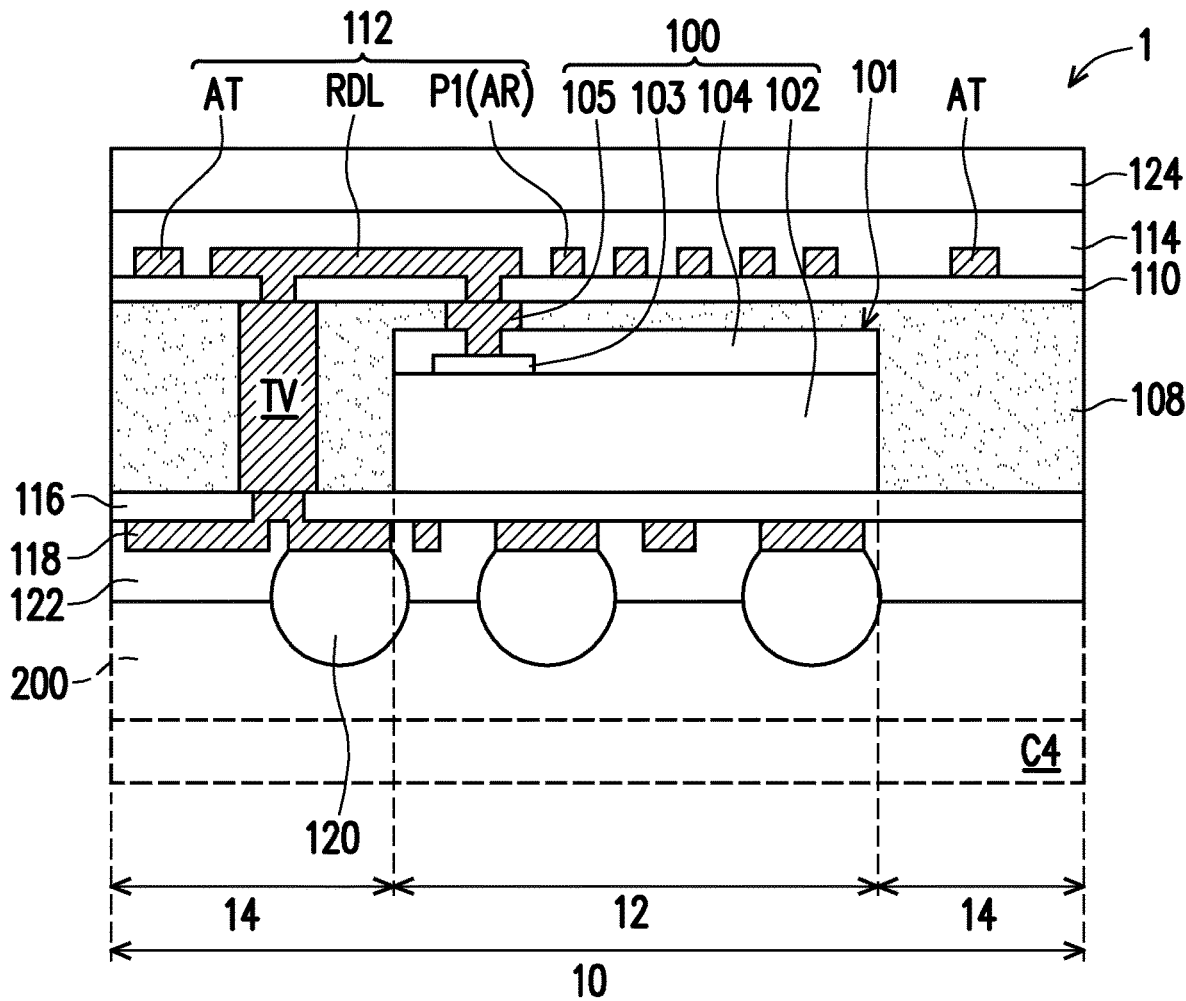

Referring to FIG. 4F, a protection layer 124 is optionally formed over the polymer layer 114, and the buffer layer 200 and the carrier C4 are removed. The same sensor package 1 as shown in FIG. 1G is thus completed.

The above embodiments in which the sensor package 1 has a single ring as an antenna transmitter structure AT and a single layer of first patterns P1 as an antenna receiver structure AR are provided for illustration purposes, and are not construed as limiting the present disclosure. In alternative embodiments, the antenna transmitter structure AT can be designed to have a double-ring shape or another suitable shape, and the antenna receiver structure AR can be designed to have multiple patterns at different levels.

The sensor packages of the disclosure serving as fingerprint sensor packages are illustrated below. In some embodiments, the sensor package 1/2/3/4/5/6 includes a semiconductor chip 100 and a redistribution layer structure 112. The semiconductor chip 100 has a sensing surface 101. The redistribution layer structure 112 is arranged to form an antenna transmitter structure AT aside the semiconductor chip 100 and an antenna receiver structure AR over the sensing surface 101 of the semiconductor chip 100. In some embodiments, the antenna transmitter structure AT in the periphery region 14 surrounds the antenna receiver structure AR in the chip region 12.

Figure 5:
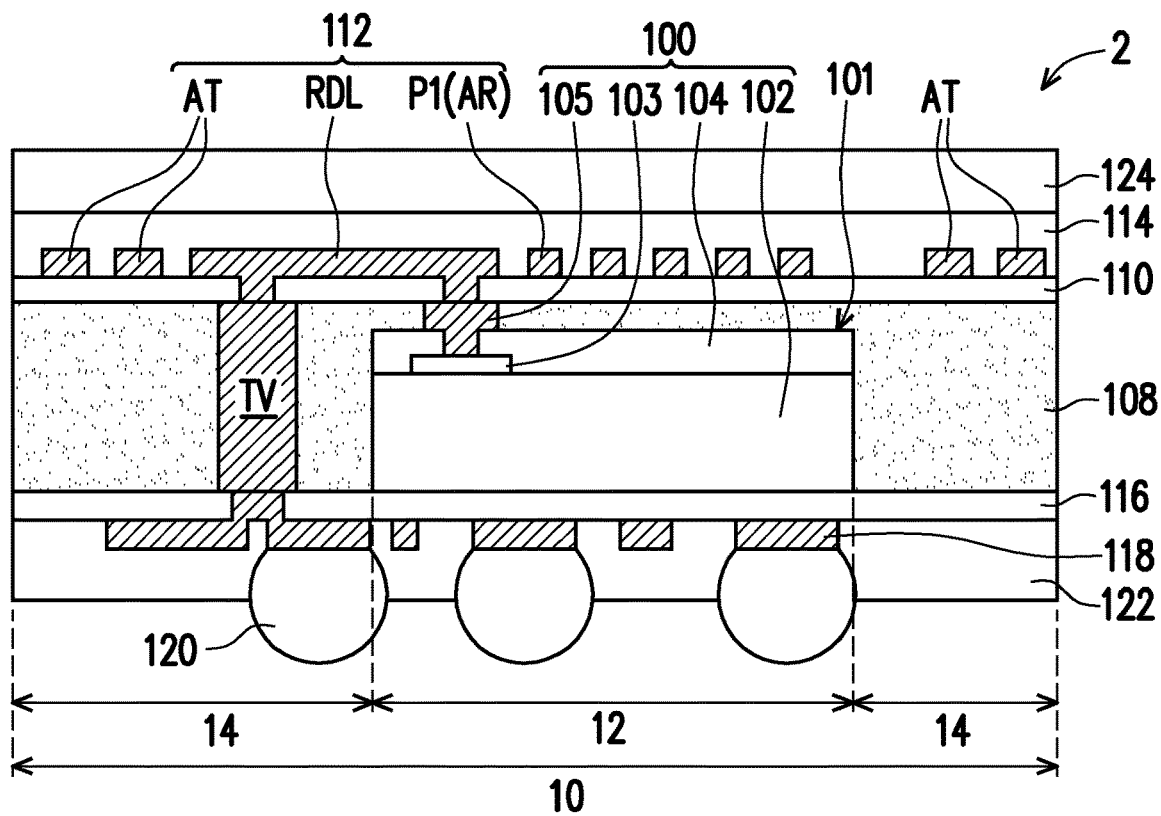
FIGS. 5 and 7-10 are cross-sectional views of sensor packages in accordance with some embodiments.
Figure 6:
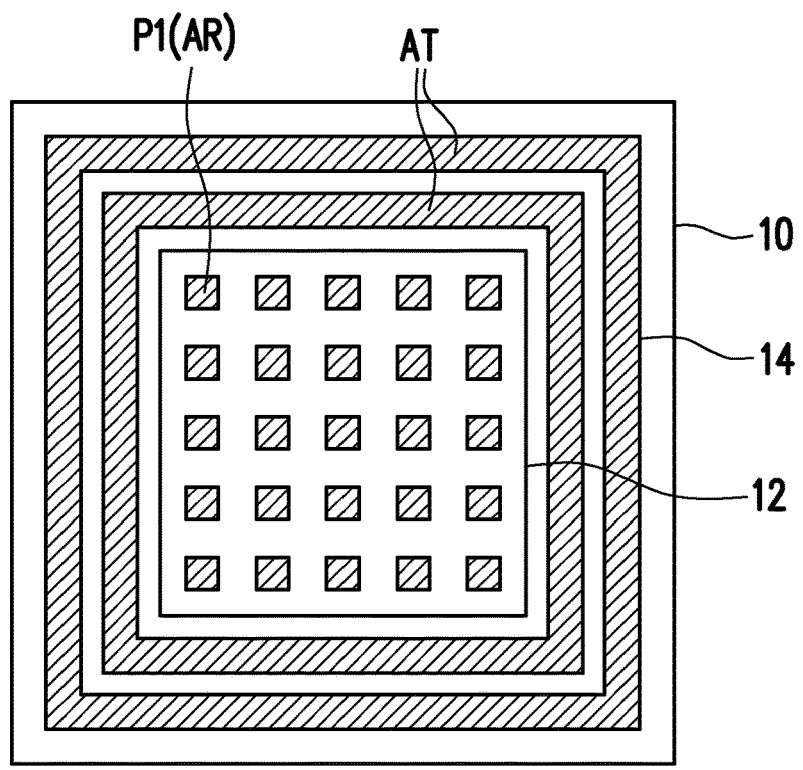
FIG. 6 is a simplified top view of an antenna transmitter structure and an antenna receiver structure of a sensor package in accordance with some embodiments.

In some embodiments, the redistribution layer structure 112 further includes a redistribution layer RDL between the antenna transmitter structure AT and the antenna receiver structure AR. The redistribution layer RDL is configured to connect a through-via TV in the periphery region 14 to a connector 105 of the semiconductor chip 100 in the chip region 12. In some embodiments, the antenna transmitter structure AT has a single-ring structure surrounding the first patterns P1 of the antenna receiver structure AR, as shown in the cross-section views of FIGS. 1G and 4F and the top views of FIGS. 2 and 3. In alternative embodiments, the antenna transmitter structure AT has a double-ring structure surrounding the first patterns P1 of the antenna receiver structure AR, as shown in the cross-section view of FIG. 5 and the top view of FIG. 6.

Figure 7:
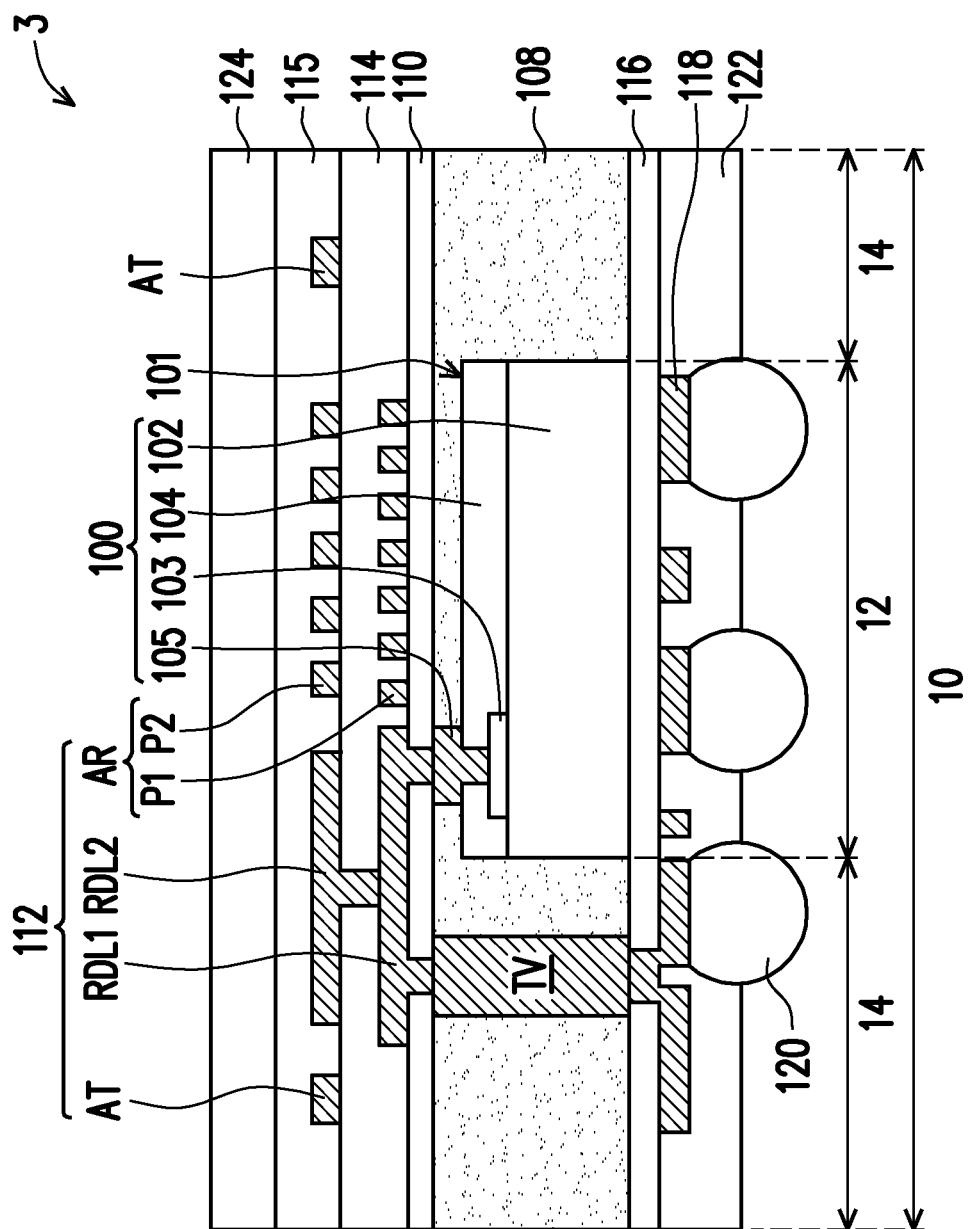
Figure 8:
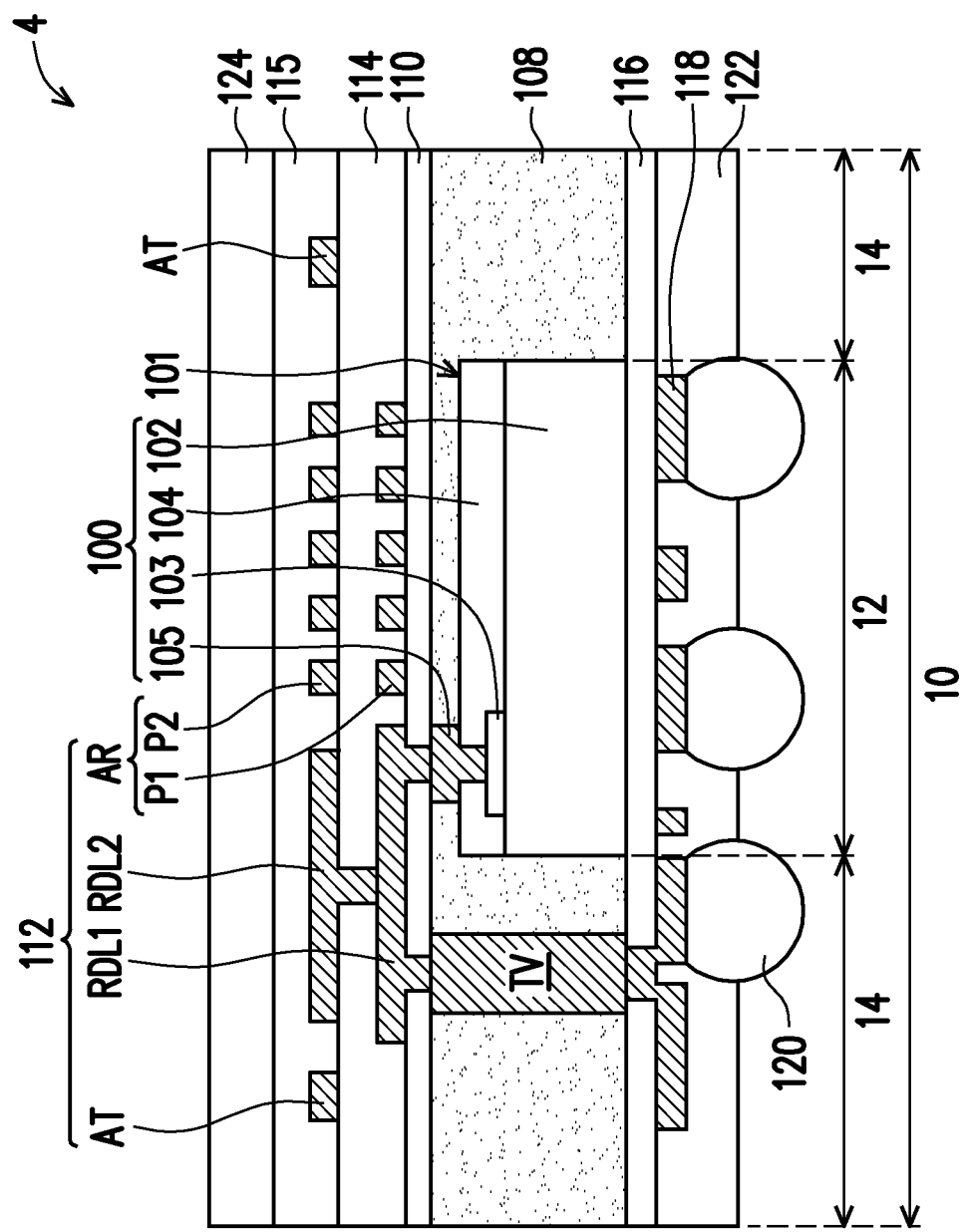

In some embodiments, the redistribution layer structure 112 is a multi-layer structure rather than a single-layer structure. For example, as shown in the sensor package 3 of FIG. 7 and the sensor package 4 of FIG. 8, the redistribution layer structure 112 is a double-layer structure that includes redistribution layers RDL1 and RDL2, an antenna transmitter structure AT, and an antenna receiver structure AR including first patterns P1 and second patterns P2. In some embodiments, the redistribution layer RDL1 is formed to electrically connect to the through-via TV, and the first patterns P1 of the antenna receiver structure AR are simultaneously formed over the sensing surface 101 of the semiconductor chip 100. Thereafter, the redistribution layer RDL2 is formed to electrically connect to the redistribution layer RDL1, the second patterns P2 of the antenna receiver structure AR are simultaneously formed over the first patterns P1, and the antenna transmitter structure AT is simultaneously formed around the second patterns P2. Thereafter, a polymer layer 115 and an optional protection layer 124 are formed over the antenna transmitter structure AT and the antenna receiver structure AR. In some embodiments, the second patterns P2 are not aligned with the first patterns P1, as shown in FIG. 7. In some embodiments, the first patterns P1 serve as enhancement patterns, and the second patterns P2 serve as sensing electrodes. In alternative embodiments, the second patterns P2 are aligned with the first patterns P1, as shown in FIG. 8. In alternative embodiments, the first patterns P1 and the second patterns P2 serve as sensing electrodes.

Figure 9:
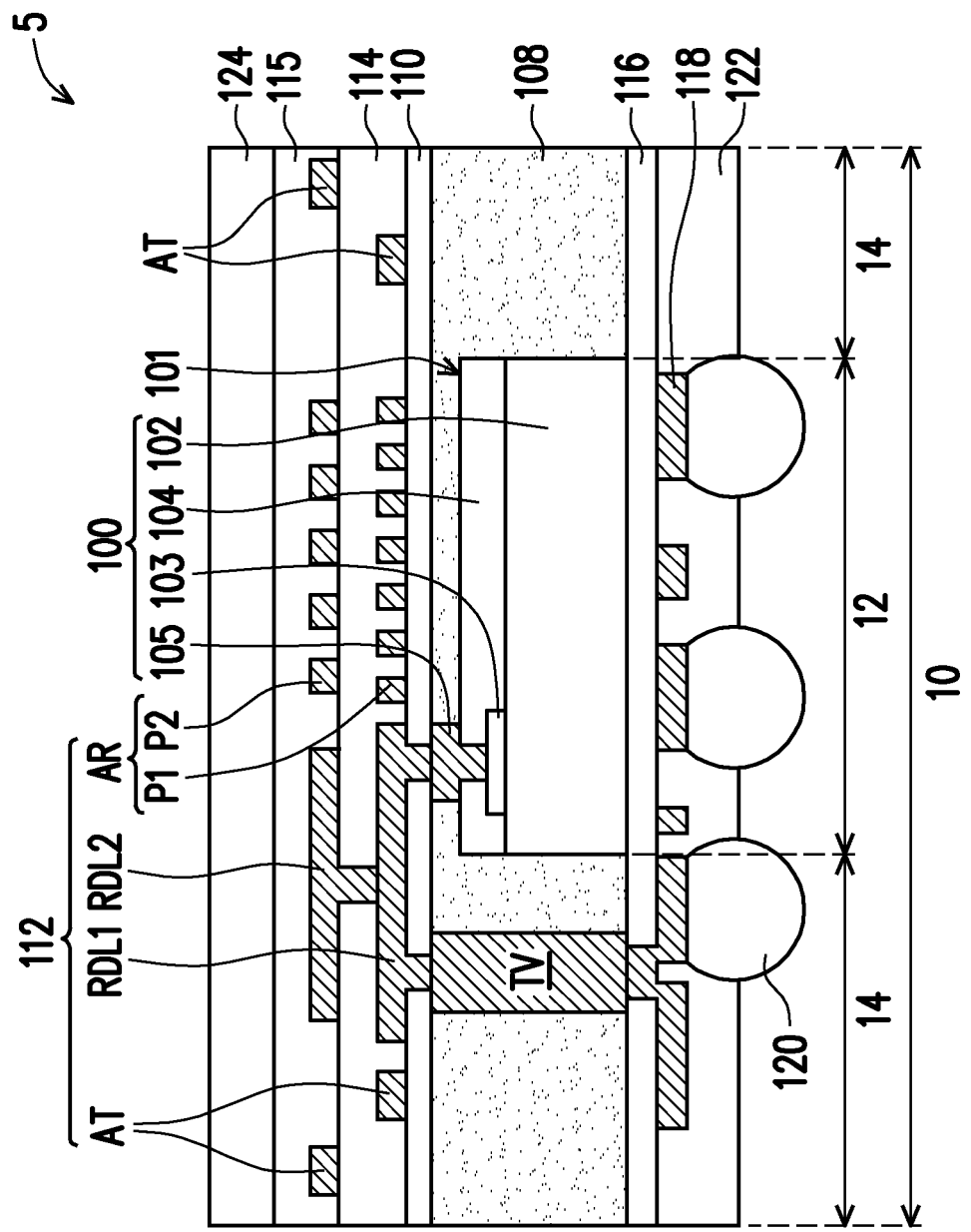

The sensor package 5 of FIG. 9 is similar to the sensor package 3 of FIG. 7, and the difference between them lies in that the antenna transmitter structure AT in FIG. 9 has two patterns at different levels. Specifically, the inner pattern of the antenna transmitter structure AT is formed during the forming of the redistribution layer RDL1 and the first patterns P1, and the outer pattern of the antenna transmitter structure AT is formed during the formation of the redistribution layer RDL2 and the second patterns P2.

Figure 10:
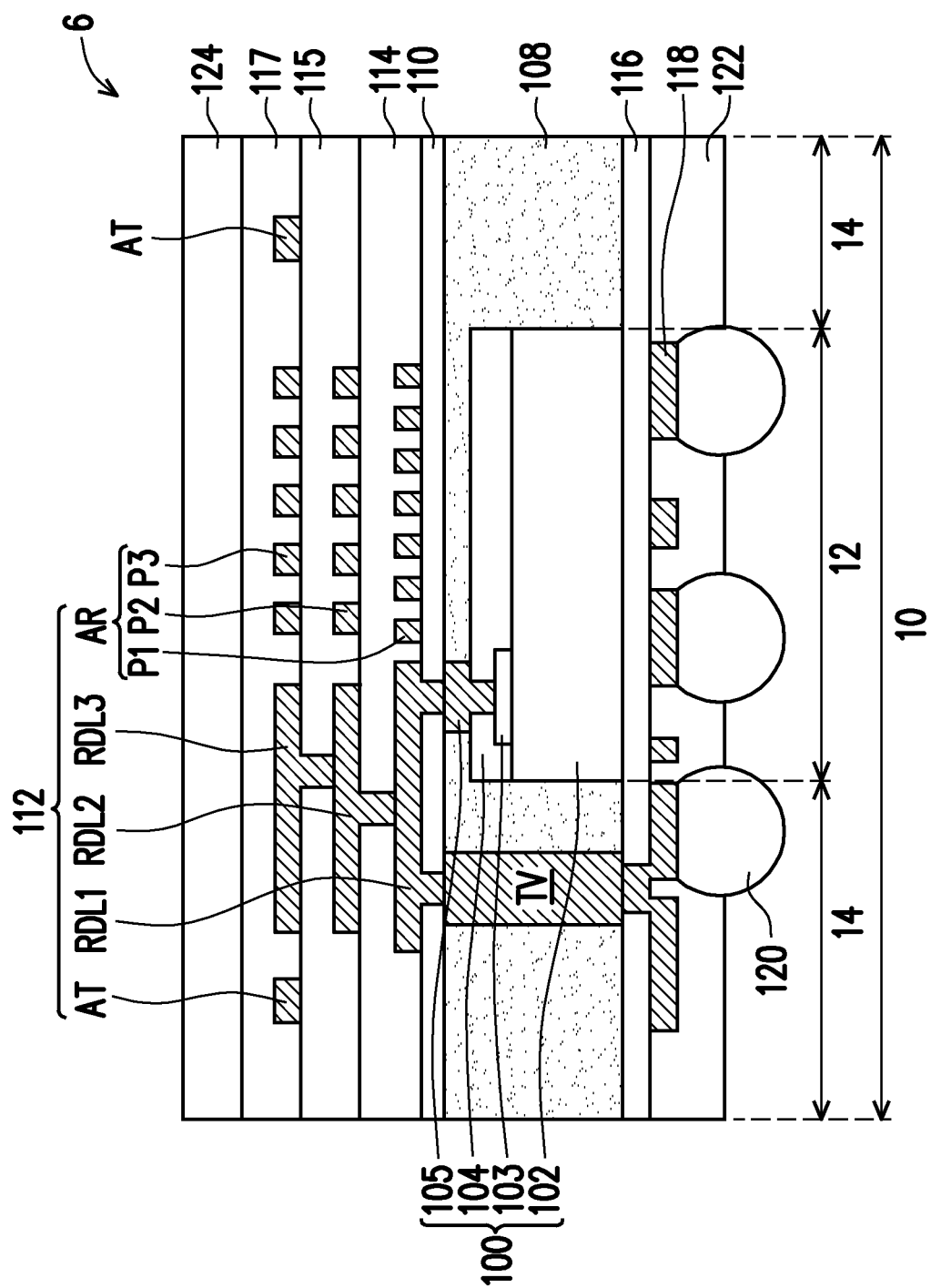

In some embodiments, as shown in the sensor package 6 of FIG. 10, the redistribution layer structure 112 is a three-layer structure that includes redistribution layers RDL1, RDL2 and RDL3, an antenna transmitter structure AT, and an antenna receiver structure AR having first patterns P1, second patterns P2 and third patterns P3. In some embodiments, the redistribution layer RDL1 is formed to electrically connect to the through-via TV, and the first patterns P1 of the antenna receiver structure AR are simultaneously formed over the sensing surface 101 of the semiconductor chip 100. Thereafter, the redistribution layer RDL2 is formed to electrically connect to the redistribution layer RDL1, and the second patterns P2 of the antenna receiver structure AR are simultaneously formed over the first patterns P1. Afterwards, the redistribution layer RDL3 is formed to electrically connect to the redistribution layer RDL2, and the third patterns P3 of the antenna receiver structure AR are simultaneously formed over the second patterns P2, and the antenna transmitter structure AT is simultaneously formed around the third patterns P3. In some embodiments, the second patterns P2 are not aligned with the first patterns P1, and the third patterns P3 are aligned with the second patterns P2. In some embodiments, the first patterns P1 serve as enhancement patterns, and second and third patterns P2 and P3 serve as sensing electrodes. Thereafter, a polymer layer 117 and an optional protection layer 124 are formed over the antenna transmitter structure AT and the antenna receiver structure AR.

In alternative embodiments, the first, second and third patterns P1, P2 and P3 are aligned to each other and all serve as sensing electrodes. In yet alternative embodiments, the first and third patterns P1 and P3 are aligned to each other and serve as sensing electrodes, while the second patterns P2 are misaligned to the first and third patterns P1 and P3 and serve as enhancement patterns. In still alternative embodiments, the first and second patterns P1 and P2 are aligned to each other and serve as sensing electrodes, while the third patterns P3 are misaligned to the first and second patterns P1 and P2 and serve as enhancement patterns.

Upon the process requirements, each pattern of the transmitter structure AT can have a ring shape, a bar shape, a spiral shape, a wave shape, a meandering shape or a combination thereof, and each of the first, second and third patterns P1, P2 and P3 of the antenna transmitter structure AT can have a ring shape, a snake shape, a bar shape, a fishbone shape, a fence shape, a grid shape, a ring shape or a combination thereof.

The shapes and numbers of the antenna transmitter patterns and the antenna receiver patterns (i.e. first to third patterns) are provided merely for illustration purposes, and are not to be construed as limiting the scope of the present disclosure. It is appreciated by people having ordinary skill in the art that other combinations and configurations of the antenna transmitter patterns and the antenna receiver patterns are possible. In some embodiments, the antenna receiver patterns are distributed evenly in the chip region. In alternative embodiments, the antenna receiver patterns are distributed randomly and unevenly in the chip region. The shapes, sizes, variations, configurations and distributions of the antenna transmitter patterns and the antenna receiver patterns are not limited by the present disclosure.

In the above embodiments, each sensor package 1/2/3/4/5/6 serves as a fingerprint sensor package. However, the present disclosure is not limited thereto. A sensor package is contemplated as falling within the spirit and scope of the present disclosure as long as an antenna transmitter structure and an antenna receiver structure are formed during the formation of a redistribution layer structure in a sensor package. For example, the sensor package of the disclosure can serve as a molecular-based sensor package, such as a biosensor package.

Figure 11:
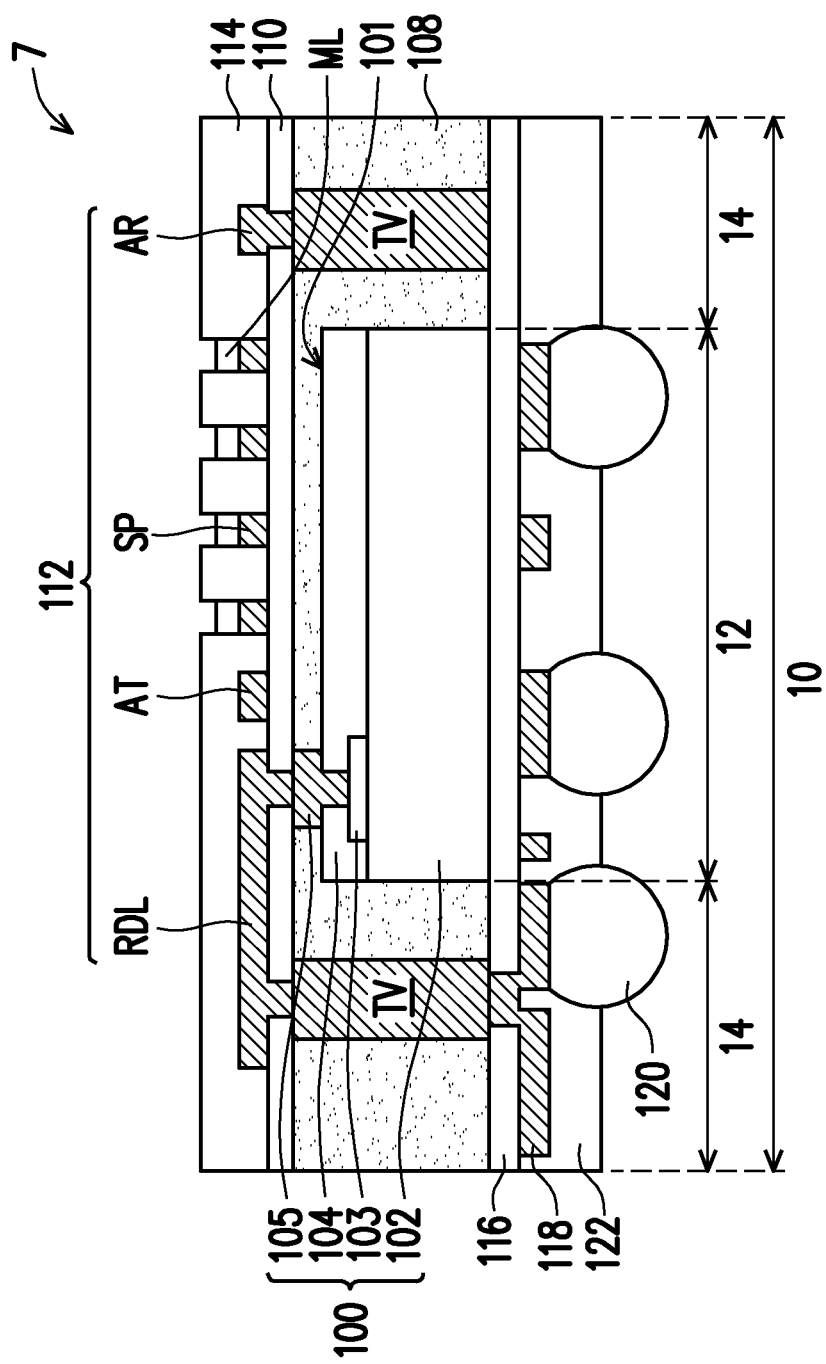
FIG. 11 to FIG. 13 are cross-sectional views of sensor packages in accordance with yet alternative embodiments.
Figure 12:
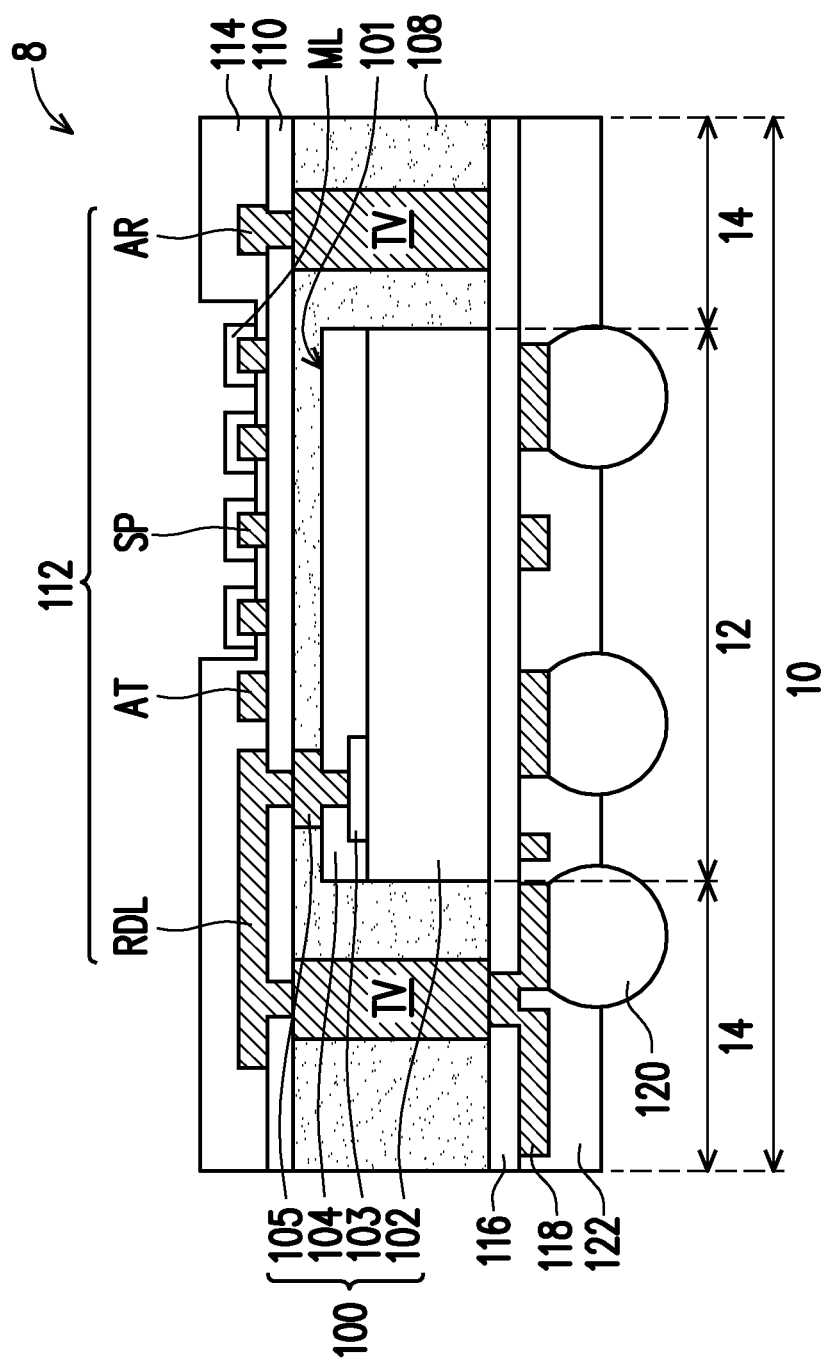
Figure 13:
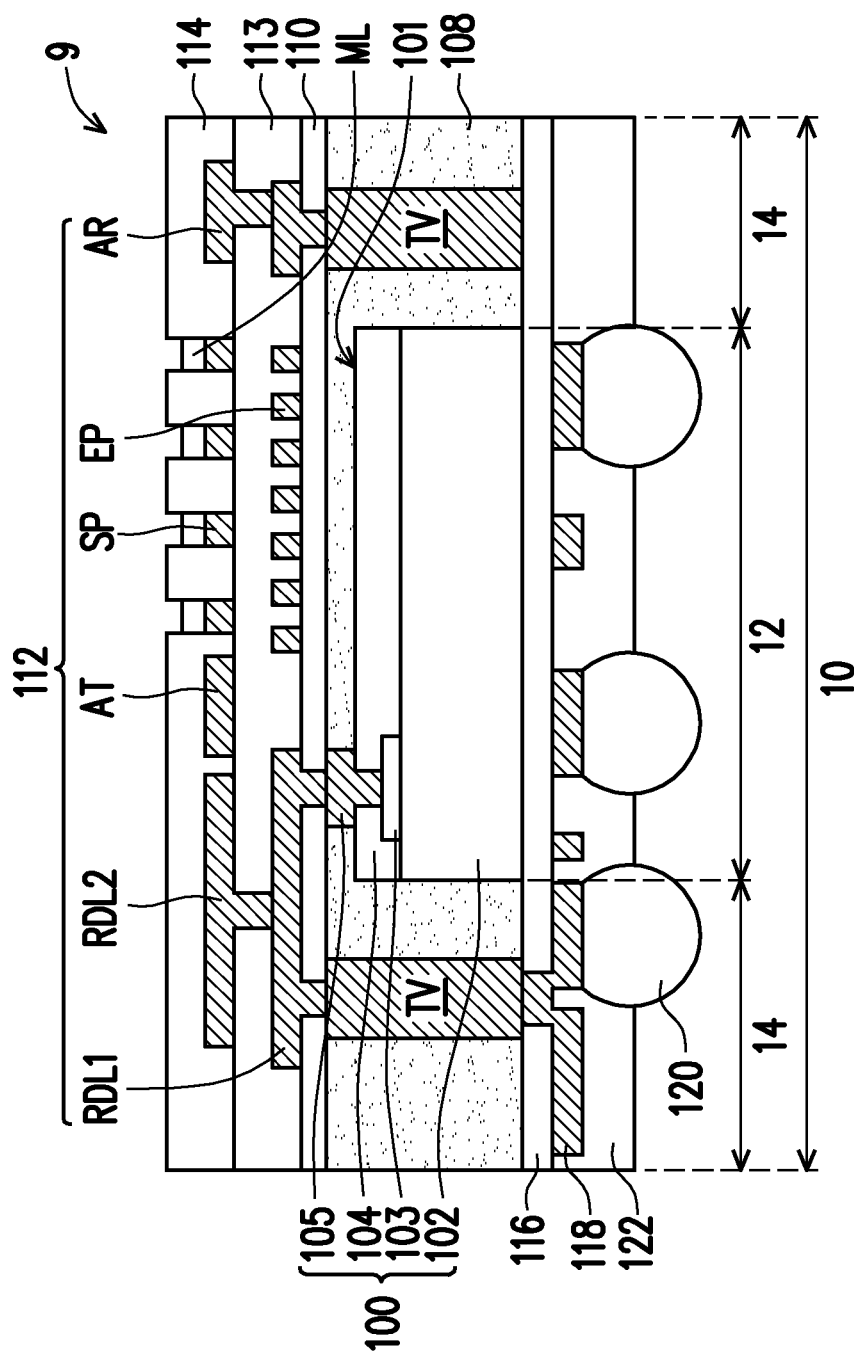
Figure 14:
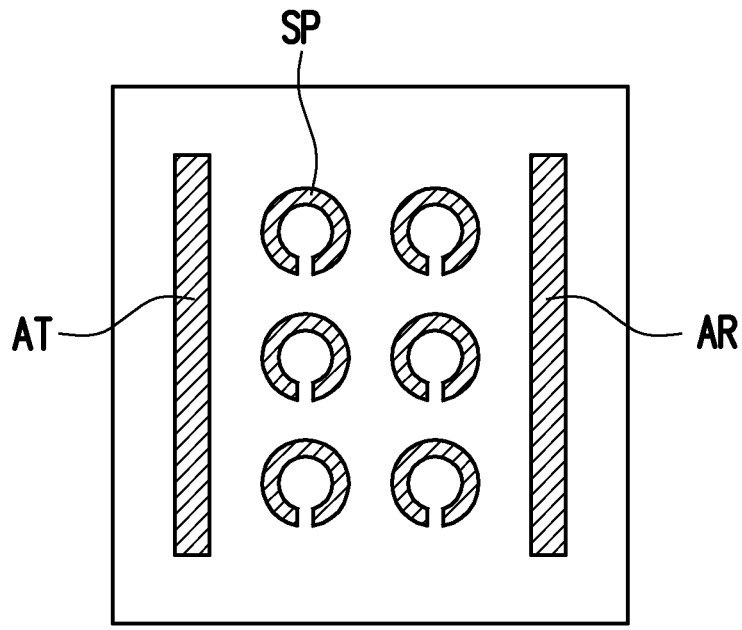
FIG. 14 is a simplified top view of an antenna transmitter structure and an antenna receiver structure of a sensor package in accordance with yet alternative embodiments.
Figure 15:
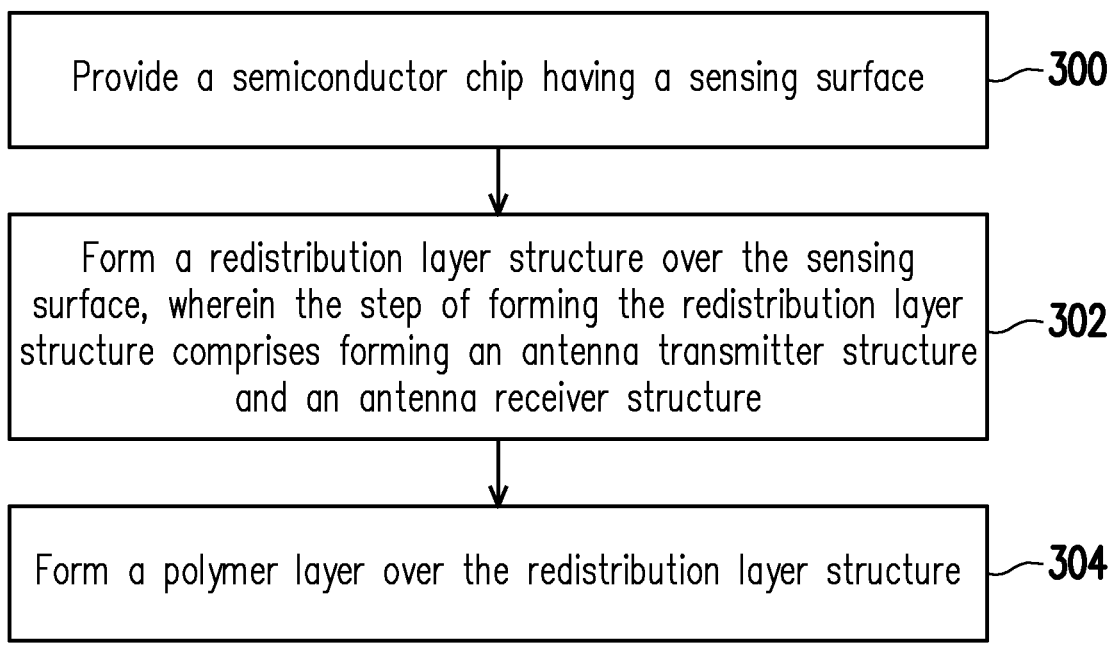
FIG. 15 is a flow chart illustrating a method of forming a sensor package in accordance with some embodiments.

FIG. 11 to FIG. 13 are cross-sectional views of sensor packages in accordance with yet alternative embodiments. FIG. 14 is a simplified top view of an antenna transmitter structure and an antenna receiver structure of a sensor package in accordance with yet alternative embodiments. FIG. 15 is a flow chart illustrating a method of forming a sensor package in accordance with some embodiments.

The method of forming the sensor package 7/8/9 is similar to the method of forming the sensor package 1/2/3/4/5/6, and the difference between them lies in the pattern distribution of the redistribution layer structure 112.

At process 300, a semiconductor chip 100 is provided with a sensing surface 101. In some embodiments, the semiconductor chip 100 is a logic chip, a sensor chip or an imaging chip, and the sensing surface 101 is at the front side thereof.

At process 302, a redistribution layer structure 112 is formed over the sensing surface 101, wherein the forming of the redistribution layer structure 112 includes forming an antenna transmitter structure AT and an antenna receiver structure AR.

In some embodiments, in the sensor package 1/2/3/4/5/6, the redistribution layer structure 112 is formed to have an antenna transmitter structure AT aside the semiconductor chip 100, an antenna receiver structure AR over the sensing surface 101 of the semiconductor chip 100, and a redistribution layer RDL between the antenna transmitter structure AT and the antenna receiver structure AR.

In the sensor package 7/8, the redistribution layer structure 112 is formed to have sensing patterns SP over the sensing surface 101 of the semiconductor chip 100, an antenna transmitter structure AT and an antenna receiver structure AR at two sides of the sensing patterns SP, and a redistribution layer RDL aside the antenna transmitter structure AT. In some embodiments, in the sensor package 7/8/9, the redistribution layer RDL is formed to electrically connect to a through-via TV and the connector 105, the antenna transmitter structure AT is formed to electrically couple to a signal transmitting terminal (not shown), the sensing patterns SP are formed to electrically couple to the semiconductor chip 100, and the antenna receiver structure AR is formed to electrically connect to another through-via TV aside the semiconductor chip 100.

In the sensor package 9, the redistribution layer structure 112 is formed to have enhancement patterns EP over the sensing surface 101 of the semiconductor chip 100, a redistribution layers RDL1 aside the enhancement patterns EP, sensing patterns SP over the enhancement patterns EP, an antenna transmitter structure AT and an antenna receiver structure AR at two sides of the sensing patterns SP, and a redistribution layer RDL2 aside the antenna transmitter structure AT. In some embodiments, in the sensor package 9, the redistribution layer RDL1 is formed to electrically connect to a through-via TV and a connector 105, the redistribution layer RDL2 is formed to electrically connect to the redistribution layer RDL1, the antenna transmitter structure AT is formed to electrically couple to a signal transmitting terminal (not shown), the sensing patterns SP are formed to electrically couple to the semiconductor chip 100, and the antenna receiver structure AR is formed to electrically connect to another through-via TV aside the semiconductor chip 100. In some embodiments, the enhancement patterns EP are floating electrodes which are, for example, partially overlapped with or separating from the sensing electrodes upon the design requirements. In alternative embodiments, the enhancement patterns EP are electrically coupled to the sensing patterns SP.

At process 304, a polymer layer 114 is formed over the redistribution layer structure 112. In some embodiments, in the sensor package 1/2/3/4/5/6, the polymer 114 completely covers the antenna transmitter structure AT and the antenna receiver structure AR. In alternative embodiments, in the sensor package 7/8/9, the polymer 114 covers the antenna transmitter structure AT and the antenna receiver structure AR while exposes top surfaces of the sensing patterns SP. For example, the polymer 114 is first blanket-formed over the redistribution layer structure 112, and then partially removed until the sensing patterns SP are exposed.

The sensor packages of the disclosure serving as molecular-based sensor packages are illustrated below. In some embodiments, the sensor package 7/8/9 includes a semiconductor chip 100 and a redistribution layer structure 112. The semiconductor chip 100 has a sensing surface 101. The redistribution layer structure 112 is arranged to form sensing patterns SP over the sensing surface 101 of the semiconductor chip 100 and to form an antenna transmitter structure AT and an antenna receiver structure AR aside the sensing patterns SP. In some embodiments, the sensor package 7/8/9 further includes a polymer layer 114 and molecular linkers ML, the polymer layer 114 covers the antenna transmitter structure AT and the antenna receiver structure AR while exposes top surfaces of the sensing patterns SP, and the molecular linkers ML respectively cover the exposed top surfaces of the sensing patterns SP.

In some embodiments, the surfaces of the molecular linkers ML are lower than the surface of the adjacent polymer layer 114, as shown in FIG. 11 and FIG. 13. In alternative embodiments, the surfaces of the molecular linkers ML are higher than the surface of the adjacent polymer layer 114, as shown in FIG. 12.

In some embodiments, the sensor package 7/8/9 serves as a molecular-based sensor package or a biosensor package for sensing and detecting target molecules or biomolecules, and the sensing patterns SP serve as a resonator and are arranged in an array between the antenna transmitter structure AT and the antenna receiver structure AR. In some embodiments, when the target molecules or biomolecules binds to the molecular linkers ML or bio-linkers, there is a RF resonance frequency change, a capacitance change and/or a current change in the sensor package 7/8/9, so the concentration/amount of target molecules or biomolecules in air or liquid can be obtained based on the capacitance change and/or the current change.

In some embodiments, each of the antenna transmitter structure AT and the antenna receiver structure AR has a bar shape, and each of the sensing patterns SP has a split-ring shape, as shown in the top view of FIG. 14. However, the disclosure is not limited thereto. The shape of each of the antenna transmitter structure AT, the antenna receiver structure AR and the sensing patterns SP can be adjusted upon the process requirements. In other words, each of the antenna transmitter structure and the antenna receiver structure have a bar shape, a spiral shape, a wave shape, a meandering shape or a combination thereof, and each of the sensing patterns SP has a split-ring shape or another shape that exhibit the same resonance frequency as the transceiver.

The shapes and numbers of the antenna transceiver patterns and the sensing patterns are provided merely for illustration purposes, and are not to be construed as limiting the scope of the present disclosure. It is appreciated by people having ordinary skill in the art that other combinations and configurations of the antenna transceiver patterns and the sensing patterns are possible. In some embodiments, the sensing patterns are distributed evenly in the chip region. In alternative embodiments, the sensing patterns are distributed randomly and unevenly in the chip region. The shapes, sizes, variations, configurations and distributions of the antenna transceiver pattern and the sensing patterns are not limited by the present disclosure.

In view of the above, in some embodiments of the present disclosure, an antenna transmitter structure and an antenna receiver structure are formed during the formation of a redistribution structure in a sensor package, so the process can be greatly simplified and the package size can be significantly reduced. The sensor package of the disclosure can serve as a fingerprint sensor package or a molecular-based sensor (e.g., a biosensor) package.

In accordance with some embodiments of the present disclosure, a sensor package includes a semiconductor chip and a redistribution layer structure. The semiconductor chip has a sensing surface. The redistribution layer structure is arranged to form an antenna transmitter structure aside the semiconductor chip and an antenna receiver structure over the sensing surface of the semiconductor chip.

In accordance with alternative embodiments of the present disclosure, a sensor package includes a semiconductor chip and a redistribution layer structure. The semiconductor chip has a sensing surface. The redistribution layer structure is arranged to form a plurality of sensing patterns over the sensing surface of the semiconductor chip and to form an antenna transmitter structure and an antenna receiver structure aside the plurality of sensing patterns.

In accordance with yet alternative embodiments of the present disclosure, a method of forming a sensor package includes the following operations. A semiconductor chip having a sensing surface is provided. A redistribution layer structure is formed over the sensing surface, wherein the forming of the redistribution layer structure includes forming an antenna transmitter structure and an antenna receiver structure. A polymer layer is formed over the redistribution layer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor chip, having a first side and a second side opposite to each other and comprising a connector protruding from the first side thereof;
an encapsulant, disposed around the semiconductor chip and in contact with the connector;
a first redistribution layer structure, disposed at the first side of the semiconductor chip and comprising a first conductive feature in contact with the connector of the semiconductor chip and a plurality of second conductive features laterally aside the first conductive feature, wherein the second conductive features are separated from the semiconductor chip by a polymer material of the first redistribution layer structure; and
a second redistribution layer structure, disposed at the second side of the semiconductor chip.

2. The semiconductor package of claim 1, wherein a semiconductor substrate of the semiconductor chip is in contact with a polymer material of the second redistribution layer structure.

3. The semiconductor package of claim 1, wherein the second conductive features of the first redistribution layer structure comprise an antenna transmitter structure and an antenna receiver structure.

4. The semiconductor package of claim 3, wherein from a top view, the antenna transmitter structure is outside of a chip region of the semiconductor chip, and the antenna receiver structure is within the chip region of the semiconductor chip.

5. The semiconductor package of claim 3, wherein the antenna transmitter structure surrounds the antenna receiver structure.

6. The semiconductor package of claim 3, wherein the antenna receiver structure has an island shape, a snake shape, a bar shape, a fishbone shape, a fence shape, a grid shape, a ring shape or a combination thereof.

7. The semiconductor package of claim 1, wherein the semiconductor chip has a sensing surface at the first side.

8. The semiconductor package of claim 1, further comprising a protection layer covering the first redistribution layer structure.

9. The semiconductor package of claim 1, further comprising bumps electrically connected to the second redistribution layer structure.

10. A semiconductor package, comprising:
a semiconductor chip, having a first side and a second side opposite to each other and comprising a connector protruding from the first side thereof;
a first redistribution layer structure, disposed at the first side of the semiconductor chip and electrically connected to the connector;
an encapsulant, surrounding a sidewall of the semiconductor chip, extending into a space between the first redistribution layer structure and the semiconductor chip, and encapsulating the connector; and
a second redistribution layer structure, disposed at the second side of the semiconductor chip, wherein the second side of the semiconductor chip is free of metal features and in contact with the second redistribution layer structure.

11. The semiconductor package of claim 10, wherein a semiconductor substrate of the semiconductor chip is in contact with a polymer material of the second redistribution layer structure.

12. The semiconductor package of claim 10, further comprising a first portion of a polymer layer disposed between and in contact with a redistribution layer of the first redistribution layer structure and the encapsulant.

13. The semiconductor package of claim 12, further comprising a plurality of sensing patterns, an antenna transmitter structure and an antenna receiver structure laterally aside a redistribution layer of the first redistribution layer structure.

14. The semiconductor package of claim 13, wherein the sensing patterns are located on a second portion of the polymer layer.

15. The semiconductor package of claim 13, further comprising a protection layer covering the antenna transmitter structure and the antenna receiver structure while exposing top surfaces of the sensing patterns.

16. The semiconductor package of claim 13, wherein each of the antenna transmitter structure and the antenna receiver structure has a bar shape, a spiral shape, a wave shape, a meandering shape or a combination thereof.

17. The semiconductor package of claim 13, wherein each of the sensing patterns has a split-ring shape.

18. A method of forming a semiconductor package, comprising:
providing a semiconductor chip having a first side and a second side opposite to each other and comprising a connector protruding from the first side thereof;

encapsulating the semiconductor chip with an encapsulant, wherein the encapsulant is in contact with the connector;

forming a first redistribution layer structure at the first side of the semiconductor chip, wherein the first redistribution layer structure comprises a first conductive feature in contact with the connector of the semiconductor chip and a plurality of second conductive features laterally side the first conductive feature, wherein the second conductive features are separated from the semiconductor chip by a polymer material of the first redistribution layer structure;

forming a protection layer over the first redistribution layer structure; and forming a second redistribution layer structure at the second side of the semiconductor chip.

19. The method of claim 18, wherein a semiconductor substrate of the semiconductor chip is in contact with a polymer material of the second redistribution layer structure.

20. The method of claim 18, wherein the second conductive features are formed as an antenna transmitter structure and an antenna receiver structure.

* * * * *